US012734488B2

(12) United States Patent
Madhavaram et al.

(10) Patent No.: US 12,734,488 B2
(45) Date of Patent: Sep. 15, 2026

(54) POINT OF USE OR POINT OF DISPENSE FILTER WITH MULTIPLE PLEAT PACKS

(71) Applicant: ENTEGRIS, INC., Billerica, MA (US)

(72) Inventors: Kalyan Madhavaram, Billerica, MA (US); Bryan Carl Cochran, Lakeville, MN (US); John Paul Puglia, Townsend, MA (US); J. Karl Niermeyer, Tyngsboro, MA (US); Krishna Kamath, North Billerica, MA (US); Christopher Paul Barck, North Billerica, MA (US); Yoshikimi Douglas Hisano, Malden, MA (US)

(73) Assignee: Entegris, Inc., Billerica, MA (US)

( * ) Notice: Subject to any disclaimer, the term of this patent is extended or adjusted under 35 U.S.C. 154(b) by 29 days.

(21) Appl. No.: 18/199,252

(22) Filed: May 18, 2023

(65) Prior Publication Data

US 2023/0302416 A1 Sep. 28, 2023

Related U.S. Application Data

(62) Division of application No. 15/517,638, filed as application No. PCT/US2015/051981 on Sep. 24, 2015, now Pat. No. 11,684,898.

(Continued)

(51) Int. Cl.
*B01D 71/00* (2006.01)
*B01D 19/00* (2006.01)
(Continued)

(52) U.S. Cl.
CPC ......... *B01D 71/68* (2013.01); *B01D 19/0031* (2013.01); *B01D 29/07* (2013.01);
(Continued)

(58) Field of Classification Search
CPC .... B01D 71/68; B01D 19/0031; B01D 29/07; B01D 29/52; B01D 29/56; B01D 35/30;
(Continued)

(56) References Cited

U.S. PATENT DOCUMENTS 4,129,429 A 12/1978 Humbert et al.
RE32,185 E * 6/1986 Copley ................ B01D 46/121 95/280

(Continued)

FOREIGN PATENT DOCUMENTS

CN 1332643 A 11/2007
CN 102215933 A 10/2011

(Continued)

*Primary Examiner* — T. Bennett Mckenzie

(57) ABSTRACT

Embodiments provide a filter with a generally rectangular, non-cylindrical profile. The filter may have multiple pleat packs positioned between pleat covers that define regions and flow channels in a cavity of the filter body. The pleat covers have openings that allow a fluid to flow through the multiple pleat packs via parallel flows or series flows. End caps bonded to the body define flow passages for directing the fluid from an inlet to an outlet via the pleat packs for series or parallel filtration. The pleat packs may be made of the same or different materials and may be configured with the same or different heights based on flow requirements. A cage or a separator may be positioned between the pleat packs. The pleat packs may be made of a continuous pleated membrane with bridges defining a space between the pleat packs to accommodate the cage or separator.

5 Claims, 21 Drawing Sheets

Related U.S. Application Data

(60) Provisional application No. 62/062,690, filed on Oct. 10, 2014.

(51) Int. Cl.

| | |
|---|---|
| ***B01D 29/07*** | (2006.01) |
| ***B01D 29/52*** | (2006.01) |
| ***B01D 29/56*** | (2006.01) |
| ***B01D 35/30*** | (2006.01) |
| ***B01D 46/12*** | (2022.01) |
| ***B01D 46/42*** | (2006.01) |
| ***B01D 46/52*** | (2006.01) |
| ***B01D 46/54*** | (2006.01) |
| ***B01D 46/58*** | (2022.01) |
| ***B01D 46/62*** | (2022.01) |
| ***B01D 63/00*** | (2006.01) |
| ***B01D 63/14*** | (2006.01) |
| ***B01D 71/26*** | (2006.01) |
| ***B01D 71/34*** | (2006.01) |
| ***B01D 71/36*** | (2006.01) |
| ***B01D 71/56*** | (2006.01) |
| ***B01D 71/68*** | (2006.01) |
| ***H10P 72/00*** | (2026.01) |

(52) U.S. Cl.

CPC ............. *B01D 29/52* (2013.01); *B01D 29/56* (2013.01); *B01D 35/30* (2013.01); *B01D 35/308* (2013.01); *B01D 46/12* (2013.01); *B01D 46/42* (2013.01); *B01D 46/521* (2013.01); *B01D 46/543* (2013.01); *B01D 46/58* (2022.01); *B01D 46/62* (2022.01); *B01D 63/00* (2013.01); *B01D 63/14* (2013.01); *B01D 71/261* (2022.08); *B01D 71/262* (2022.08); *B01D 71/34* (2013.01); *B01D 71/36* (2013.01); *B01D 71/56* (2013.01); *H10P 72/0404* (2026.01); *B01D 2265/06* (2013.01); *B01D 2319/02* (2013.01); *B01D 2319/04* (2013.01); *B01D 2325/20* (2013.01); *B01D 2325/42* (2013.01)

(58) Field of Classification Search

CPC ...... B01D 35/308; B01D 46/12; B01D 46/42; B01D 46/521; B01D 46/543; B01D 46/58; B01D 46/62; B01D 63/00; B01D 63/14; B01D 71/261; B01D 71/262; B01D 71/34; B01D 71/36; B01D 71/56; B01D 2265/06; B01D 2319/02; B01D 2319/04; B01D 2325/20; B01D 2325/42; H01L 21/67023

USPC .......................................................... 55/484

See application file for complete search history.

(56) References Cited

U.S. PATENT DOCUMENTS

| | | | | | |
|---|---|---|---|---|---|
| 4,678,578 | A * | 7/1987 | Nodes | B01D 36/02 | 55/497 |
| 5,755,844 | A | 5/1998 | Arai et al. | | |
| 6,224,655 | B1 | 5/2001 | Messier | | |
| 7,247,245 | B1 * | 7/2007 | Proulx | B01D 27/07 | 210/450 |
| 8,337,700 | B1 | 12/2012 | Zuk, Jr. | | |
| 2003/0150199 | A1 | 8/2003 | Tanaka et al. | | |
| 2004/0065197 | A1 * | 4/2004 | LaBarge | B01D 53/0415 | 95/90 |
| 2006/0096263 | A1 | 5/2006 | Kahlbaugh et al. | | |
| 2006/0230731 | A1 | 10/2006 | Kalayci et al. | | |
| 2008/0196368 | A1 | 8/2008 | Waibel | | |
| 2009/0064648 | A1 | 3/2009 | Chi et al. | | |
| 2009/0069470 | A1 | 3/2009 | Frey et al. | | |
| 2010/0037570 | A1 | 2/2010 | Osendorf et al. | | |
| 2010/0199616 | A1 | 8/2010 | Sasaki | | |
| 2010/0257828 | A1 | 10/2010 | Shimomura et al. | | |
| 2013/0092622 | A1 * | 4/2013 | Kas | D01D 5/0084 | 210/489 |
| 2014/0231341 | A1 | 8/2014 | Sitterer et al. | | |
| 2015/0031780 | A1 | 1/2015 | Kim et al. | | |

FOREIGN PATENT DOCUMENTS

| | | | | |
|---|---|---|---|---|
| DE | 10337652 | A1 * | 3/2005 | B01D 46/0013 |
| JP | 2008202489 | A | 9/2008 | |
| JP | 2012507392 | A | 3/2012 | |
| TW | 201433346 | A | 9/2014 | |
| WO | 2010051091 | A1 | 5/2010 | |
| WO | 2014055451 | A2 | 4/2014 | |

* cited by examiner

POINT OF USE OR POINT OF DISPENSE FILTER WITH MULTIPLE PLEAT PACKS

CROSS-REFERENCE TO RELATED APPLICATIONS

This application is a divisional application of U.S. patent application Ser. No. 15/517,638. filed Apr. 7, 2017, which claims priority under 37 U.S.C. § 371 of International Application No. PCT/US2015/051981, filed Sep. 24, 2015, which in turns claims benefit of priority under 35 U.S.C. § 119 of .S. Provisional Application No. 62/062,690, filed 10 Oct. 2014, entitled "POINT OF USE OR POINT OF DISPENSE FILTER WITH MULTIPLE PLEAT PACKS," which are fully incorporated by reference herein for all purposes.

TECHNICAL FIELD

This disclosure relates to purification and filtration systems. More particularly, embodiments described herein relate to filters of various sizes used in purification and filtration systems. Even more particularly, embodiments relate to filters, including point of use ("POU") and point of dispense ("POD") filters, with multiple pleat packs for filtering fluid used in semiconductor manufacturing.

BACKGROUND OF THE RELATED ART

Contamination control is one of the most critical concerns in the manufacture of semiconductor devices. As such, filtration and purification are regularly needed for a broad range of fluids, such as chemicals, gas, water, chemical mechanical polishing/planarization slurries, etc., which are referred to herein as semiconductor manufacturing fluids.

In filtering semiconductor manufacturing fluids, there is often a need to balance particle retention (i.e., contaminant removal), flow rate, size and pressure drop across the filter. As the retention or flow rate increases, the size of the filter may also need to increase to reduce the increased pressure drop (i.e., the difference in pressure between two points of a fluid carrying network). Pressure drop occurs when frictional forces, caused by the resistance to flow, act on a fluid as it flows through a tube. For example, for a given filtration medium, reducing the pore size 50% may increase the flow resistance by 400%. This means that to maintain a desired flow rate, the pressure drop in the filter will increase dramatically. To compensate for pressure drop increases, the size of the filter housing and corresponding membrane area may have to be increased accordingly. The use of large filters, however, maybe undesirable or infeasible due to space constraints and/or other considerations.

Conventionally, cylindrical filters represented a good balance of size, particle retention or contaminant removal, flow rate and pressure loss. Hence, the semiconductor manufacturing industry has by and large adopted cylindrical filters. Rectangular and non-cylindrical filters in general have been avoided because the stress in a non-cylindrical filter requires that the filter be made larger than a comparable cylindrical filter to achieve the same filtration and flow rate. Furthermore, it is believed that the pressures and temperatures typically experienced in semi-conductor manufacturing filters would cause high localized stress in typical rectangular or non-cylindrical designs. Such stresses would cause the non-reactive materials often used in semiconductor manufacturing devices, such as perfluoroalkoxy polymer, polypropylene, and polytetrafluoroethylene, to yield, resulting in filter failure.

SUMMARY OF THE DISCLOSURE

Embodiments described herein can provide a filter with a generally rectangular, non-cylindrical profile in a compact design that may provide comparable or superior particle retention (or other purification methods), flow rate and pressure drop compared to a cylindrical filter having a comparable filter media area. In addition, embodiments can provide a better balance of these characteristics than prior rectangular filters used in the semiconductor industry (e.g., superior media area, flow or pressure drop characteristics in the same footprint; the same media area, flow rate and pressure drop in a smaller footprint, parallel and/or series filtration, etc.).

Within this disclosure, parallel filtration refers to a filtration solution that allows a fluid to flow through purification/filtration elements or membranes arranged in a parallel fashion, while series filtration refers to a filtration solution that allows a fluid to flow through a sequence of purification/filtration (P/F) elements or membranes arranged in a daisy chain fashion. In some semiconductor manufacturing processes, parallel and/or series filtration may be desired and/or required.

According to embodiments, a filter can comprise a body defining a cavity, an inlet port connected to the cavity, an outlet port connected to the cavity, and a set of P/F elements having a total P/F element volume disposed in the cavity, wherein the filter is configured for normal flow filtration.

A set of parallel regions may be disposed in the cavity, with a first side channel disposed between a first region and a first sidewall, a second side channel disposed between a second region and a second sidewall, and a center channel disposed between the first region and the second region. The first region is open to the first side channel and the center channel and the second region is open to the center channel and the second side channel. A first P/F element is disposed in the first region and a second P/F element is disposed in the second region. The P/F elements may be compressed pleat packs having a cubical, rectangular prism, or otherwise non-cylindrical shape.

The filter may provide various flow paths. For example, the inlet port can be connected to the center region and the outlet port can be connected to the first side channel and the second side channel. As another example, the inlet port can be connected to the first side channel and the outlet port can be connected to the second side channel.

The body may comprise a shell and end cap covers bonded to the shell. The shell may comprise a first sidewall opposite a second sidewall and a third sidewall opposite a fourth sidewall. There may be curved transitions between sidewalls. The first, second, third and fourth sidewalls may be curved to distribute stress. Alternatively, the first, second, third and fourth sidewalls may be flat or substantially flat.

The filter may further comprise a set of pleat covers that define the first and second region. The pleat covers may be grated or otherwise include openings so that the regions are open to the adjacent side and center channels. The pleat covers may run the length of the cavity and span from the third sidewall to the fourth sidewall. The pleat covers may be arranged in parallel. The first side channel may be disposed between the first sidewall and a first pleat cover. The second side channel may be disposed between the second sidewall and a second pleat cover. The center channel may be disposed between a third pleat cover and a fourth pleat cover.

An inlet end cap may comprise an inlet port connected to the center channel and an outlet vent port connected to the side channels. An outlet end cap may comprise an outlet port connected to the side channels and a vent port connected to the center channel. Alternatively, the inlet end cap may comprise an inlet port connected to a first side channel and a vent port connected to the second side channel and the outlet end cap may comprise an outlet port connected to the second side channel and a vent port connected to the first side channel.

Embodiments of a filter disclosed herein can have many useful applications and advantages over conventional filters having a single pleat pack. For example, in embodiments of a filter disclosed herein, multiple pleat packs can be positioned or otherwise arranged for parallel filtration or series filtration. The heights of the pleat packs may be varied based on flow requirements. Furthermore, multiple pleat packs allow the use of different membrane media to achieve custom filtration capabilities based on requirements and/or to provide superior filtration/purification.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

The drawings accompanying and forming part of this specification are included to depict certain aspects of embodiments of the invention. A clearer impression of the invention, and of the components and operation of systems provided with the invention, will become more readily apparent by referring to the exemplary, and therefore non-limiting, embodiments illustrated in the drawings, wherein identical reference numerals designate the same components. Note that the features illustrated in the drawings are not necessarily drawn to scale.

DETAILED DESCRIPTION

Figure 1:
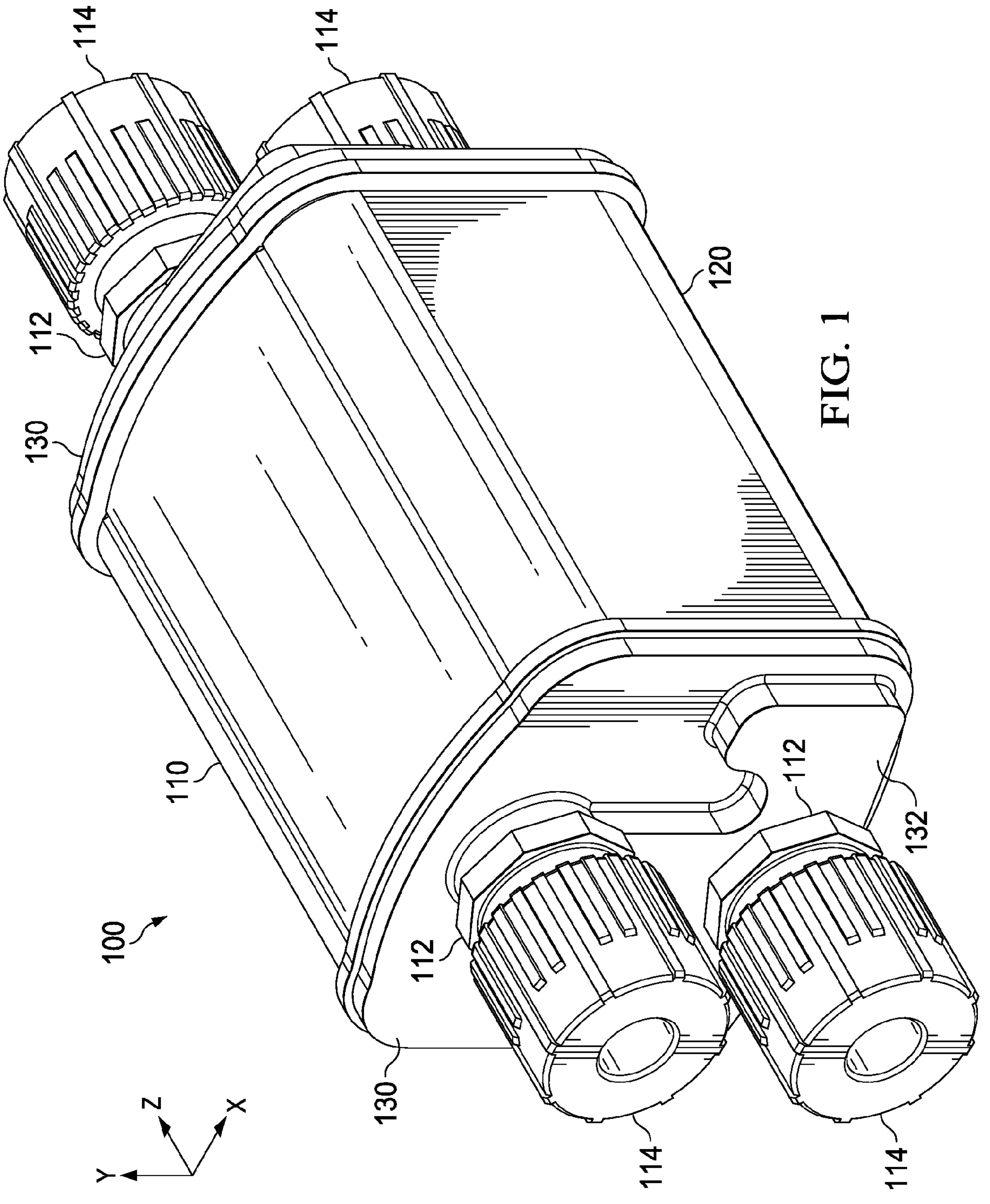
FIG. 1 depicts a perspective view of one example embodiment of a filter.

The disclosure and the various features and advantageous details thereof are explained more fully with reference to the non-limiting embodiments that are illustrated in the accompanying drawings and detailed in the following description. Descriptions of well-known starting materials, processing techniques, components and equipment are omitted so as not to unnecessarily obscure the disclosure in detail. Skilled artisans should understand, however, that the detailed description and the specific examples, while disclosing preferred embodiments, are given by way of illustration only and not by way of limitation. Various substitutions, modifications, additions or rearrangements within the scope of the underlying inventive concept(s) will become apparent to those skilled in the art after reading this disclosure.

Before describing specific embodiments, some context may be helpful. As discussed above, cylindrical filters are often used in semiconductor manufacturing to filter and/or purify semiconductor manufacturing fluids. In some cases, it may be desired or even required to have parallel filtration and/or series filtration in a filtration system. To this end, some filtration solutions may involve physically arranging multiple cylindrical filters in parallel or in series.

For example, to provide parallel filtration in a filtration system, one conventional method may involve arranging two or more conventional cylindrical filters in parallel, connecting them to a fluid path or a fluid carrying network, and directing a fluid to flow through them, essentially dividing the fluid flow into multiple sub-flows and filtering/purifying these multiple sub-flows separately (i.e., one sub-flow per filter). The filtered sub-flows may be directed from the parallelly arranged cylindrical filters into a single flow and provided to a reservoir, a pumping system component downstream the filtration system such as a feed chamber and/or a dispense chamber, or the like. As another example, to provide series filtration in a filtration system, one conventional method may involve arranging two or more conventional cylindrical filters in sequence (i.e., in series) and positioning them in a fluid path such that a fluid can be directed to flow through them sequentially, one conventional cylindrical filter at a time.

Because conventional cylindrical filters used in semiconductor manufacturing processes are not typically made to provide parallel filtration and/or series filtration, there are drawbacks in these conventional filtration solutions. For example, arranging multiple conventional cylindrical filters to perform parallel filtration and/or series filtration increases the physical footprint needed for a filtration system and thus may not be feasible for filtration systems with space constraints.

Another drawback relates to performance issues. Specifically, when set up to run independently (e.g., in a filtration system), conventional cylindrical filters of the same size and configuration may individually perform at about the same level (within an operating tolerance as specified by their manufacturers) with respect to retention or contaminant removal, flow rate, pressure loss, etc. However, the level of performance may decrease undesirably when they are arranged either in parallel or in series where the flow rate and/or pressure drop of a conventional cylindrical filter may be affected by the presence of another conventional cylindrical filter positioned parallelly or serially in the same flow path. The more complicated a fluid filtration solution is (e.g., one that has both parallel and series filtration in a fluid path), the higher the likelihood that the level of performance provided by conventional cylindrical filters may be inconsistent, unpredictable, and/or unacceptable.

Embodiments described herein can provide high performance filters that may provide superior particle retention (or purification), flow rate and/or pressure drop as compared to conventional cylindrical filters. In addition, embodiments can provide a better balance of these characteristics than prior rectangular, boxy filters used in the semiconductor industry.

In some embodiments, a filter disclosed herein can be formed of materials such as perfluoroalkoxy polymer (PFA) and other non-reactive materials such as polypropylene (PP) and polytetrafluoroethylene (PTFE) and can, thus, be suitable for use with semiconductor manufacturing fluids. Radio frequency identification (RFID) tags and other features can be integrated into a filter to promote programmed operations and facilitate filter changes by robots.

Embodiments disclosed herein can be capable of removing contaminants such as particles, ions, gases and the like from liquids. More particularly, some embodiments relate to purification of a variety of fluids including, but not limited to, semiconductor process fluids such as chemicals used in wet etch and cleaning applications.

In the context of this disclosure, "filtration" generally refers to a mechanical process of removing contaminants/impurities through a physical barrier (e.g., a filter element containing filtration media, membrane(s), peat packs made of the membrane(s), etc.) and "purification" generally refers to removing contaminants/impurities through a chemical process. The acts or steps of removing all or a portion of contaminants from a liquid or other fluid may involve filtration and/or purification including, but are not limited to, mechanical sieving, electrostatic, chemical bonding, ion exchange, chelation, adsorption, degassing, or combinations of these. Embodiments disclosed herein can be applied to filter and/or purify chemicals, for instance, photochemicals used in photolithographic processing. Accordingly, "purification and/or filtration" may be referred to herein as "P/F" and "filters" and "filters" may be used interchangeably. Likewise, "purification media" and "filtration media" may be used interchangeably.

Photochemicals may include a variety of materials such as primers, adhesion promoters, photoresists, edge bead removers, anti-reflective coatings, developers, dielectrics, and the like. These fluids can be filtered and/or purified at the point of use (POU), the subfloor or elsewhere. Embodiments disclosed herein may also be used to filter other liquids, including slurries.

Embodiments may include a P/F element for adding and/or removing material(s) from a process liquid or other fluid. Examples of materials that can be removed by such a P/F element can include, but are not limited to, particles, gels, molecular contaminants, ions, dissolved gases, bubbles, or combination of these. Materials that can be added using such a P/F element can include gases such as ozone, carbon dioxide, etc.

In some embodiments, a P/F element may include media that can add/remove material(s) to/from a liquid or other fluid. In this disclosure, "media" refers to a material or combination of materials that can remove contaminants from a liquid or other fluid and/or that can transfer something desirable into the liquid or other fluid. Examples of media can include, but are not limited to, porous membranes for particle removal; non-porous membranes for degassing liquids; porous membranes with ion exchange groups or ligands or porous membranes that contain ion exchange media within the membrane or porous membranes that encapsulate ion exchange, adsorption, or other reactive particulate media such as, but not limited to, silicon beads, ion exchange beads, or activated carbon, for removing ions, or residues in liquids. A membrane may be porous (e.g., for filtration) or non-porous (e.g., for gas exchange). In some embodiments, media can be used to transfer material(s) into a process fluid such as a liquid. An example would include a porous or non-porous membrane used for adding ozone gas or carbon dioxide gas to the liquid. In various embodiments, a filter may contain one or more types of media.

In some embodiments, a P/F element can comprise a membrane. Examples of a suitable membrane may include, but are not limited to, those made from polymeric materials. Examples of suitable polymeric materials can include, but are not limited to, polyolefins like ultra-high molecular weight polyethylene, polypropylene, and high density polyethylene; halogenated polyolefins such as polytetrafluoroethylene and polyvinylidene fluoride; perfluorinated polymers like perfluoroalkoxy polymer (PFA) and fluorinated ethylene propylene (FEP); polysulfones, polyamides including nylon 6,6, and polyesters.

In some embodiments, a porous membrane can be single- or multi-layered and can include those with symmetric or asymmetric (and combinations) of pore size across the thickness of a membrane. In some embodiments, membranes can be cast, extruded, or formed by melt blowing or electro spinning or multilayer membranes made by a combination of these.

In some embodiments, a membrane may be pleated with a support structure such as polymeric netting materials and/or other materials. By way of example, but not of limitation, a membrane may be sandwiched between layers of support material (e.g., netting or other materials).

In some embodiments, a variety of P/F media can be used, including pleated filters each formed from one or more membranes, to filter a liquid or other fluid. Such membranes can be selected to achieve desired particle size retention or certain purification result. For example, for some semiconductor manufacturing applications, porous membranes that have particle size retentions of 20 nanometer, 15 nanometer, 10 nanometer or lower may be selected. A relatively high flow rate can be maintained at these retention ratings (including, but is not limited to, greater than 15 liters per minute) for sub-15 nanometer retentions. Examples of contaminants which can be removed may include, but are not limited to, particles, gels, molecular contaminants, ions, dissolved gases, bubbles, or combinations of these.

Embodiments disclosed herein can be made from a variety of materials including but not limited to oleophilic resins, perfluorinated resin, such as, but not limited to, polytetrafluoroethylene (PTFE), fluorinated ethylene propylene (FEP), perfluoroalkoxy polymer (PFA)), polyvinylidene fluoride (PVDF), polyimide, polyetherimide, polycarbonate, polypropylene (PE), polyethylene (PE), polyether ether ketone (PEEK), metals or other materials. In some embodiments, outer layers may be formed of a relatively inexpensive polymer while the inner layer can comprise a more expensive polymer that is less likely to react with or contaminate the process fluid. For example, components of a filter may comprise an outer shell formed of polypropylene or other material that can withstand temperature and pressure requirements of an application. Inside the outer shell, an inner layer of typically more expensive, more chemically resistant, higher purity material can be thermoformed and attached to outer layers. In some embodiments, an inner layer of desired material can be over molded over the inside of the outer layers. In some embodiments, the entire wetted surface of the filter can be the more chemically resistant, higher purity polymer, such as PTFE, FEP, PFA or other material.

In some embodiments, internal filter components, such as P/F element support structures, can be made from a variety of materials including but not limited to oleophilic resins, perfluorinated resin, such as, but not limited to PTFE, FEP, PFA, PVDF, polyimide, polyetherimide, polycarbonate, PP, PE PEEK, metals or other materials. In some embodiments, a P/F element support structure can be formed of multiple layers. The core of the P/F element support structure can comprise a relatively inexpensive first polymer (e.g., polypropylene) while any layers that contact a process fluid can comprise a more chemically resistant, higher purity second polymer that is less likely to react with or contaminate the process fluid. In some embodiments, the second polymer can be over molded on the first polymer. For example, the melting temperature of PET is lower than PFA and of a PTFE membrane. Therefore, one or more portions of a filter assembly having PFA and PTFE components may be over-molded or potted with PET.

Example embodiments of a non-cylindrical filter with multiple pleat packs will now be described.

FIG. 1 depicts a diagrammatic representation of one example embodiment of a filter 100 comprising a body 110, ports 112, and fittings 114. Body 110 may comprise a shell 120 that defines an internal cavity sufficiently sized or otherwise dimensioned to accommodate P/F elements. Ports 112 can be arranged as needed on body 110 for the ingress and egress of fluid. Fittings 114 may connect ports 112 to other components of a P/F system such that a fluid can be directed to/from filter 100.

In representative embodiments, body 110 can have a generally cubical, cuboid, rectangular prism, or otherwise non-cylindrical shape. Any number of pieces may be used to form body 110. In some embodiments, a single or multi-piece shell 120 may form the sidewalls of body 110. In some embodiments, end caps 130 bonded to the ends of shell 120 may form the end walls of body 110.

In the arrangement illustrated, ports 112 are disposed on end-caps 130. End caps 130 may include flow passages (one example of which is illustrated at 132) to direct a fluid to appropriate locations in a cavity defined by body 110. One or more types of P/F media can be disposed in the cavity, as explained below. While four ports 112 are illustrated in FIG. 1, skilled artisans appreciate that filter 100 may have more or fewer ports. Skilled artisans may also appreciate that one or more of ports 112 may be arranged elsewhere, for example, on shell 120.

In operation, at least one port 112 can act as an inlet port and at least one port 112 can act as an outlet port. Filter 100 may receive a fluid through the inlet port, direct the fluid through P/F elements in the internal cavity and pass the purified/filtered fluid to downstream components through the outlet port.

Figure 2A:
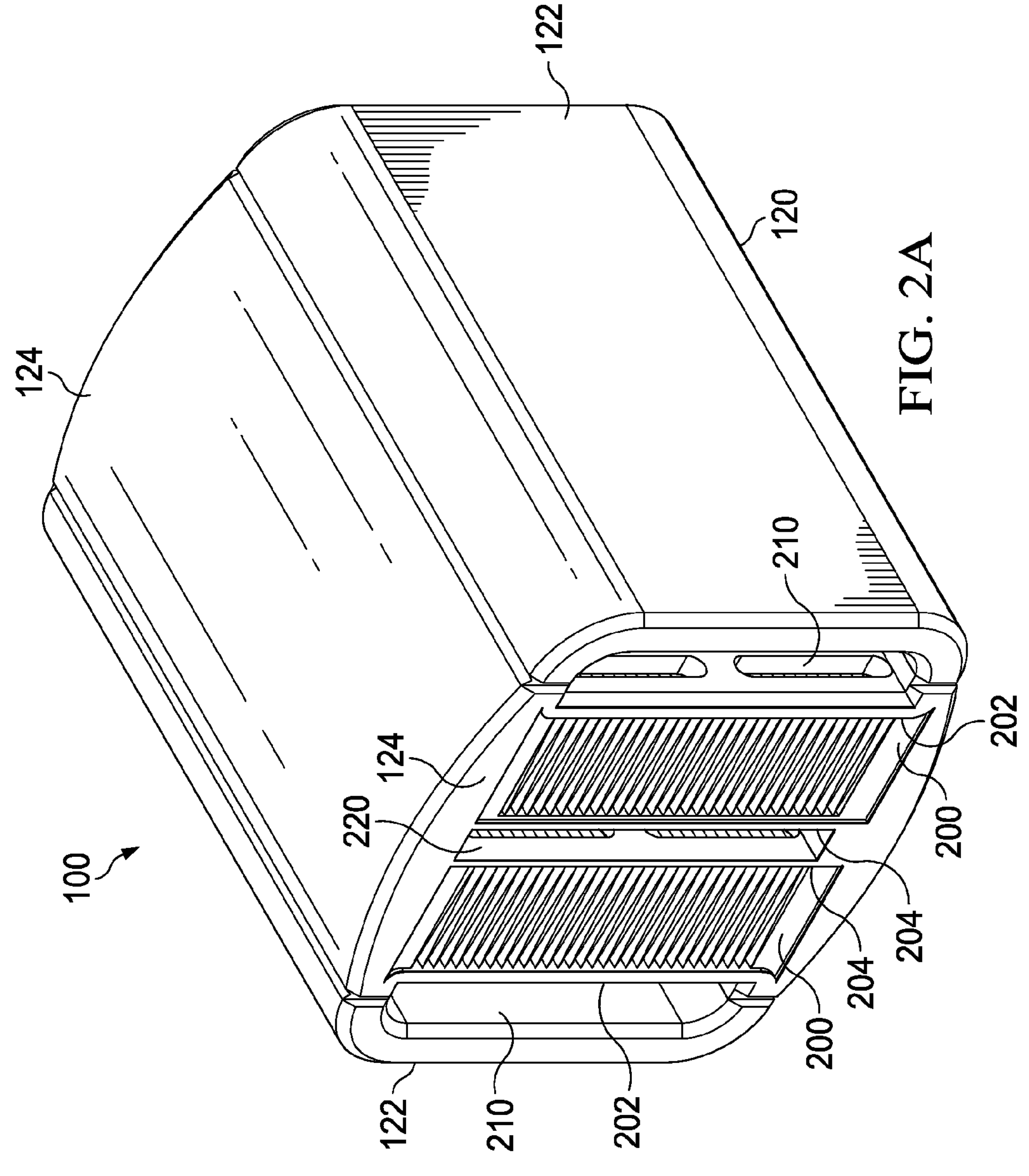
FIG. 2A depicts a perspective view of one example embodiment of a subassembly of the filter shown in FIG. 1.

FIG. 2A depicts a perspective view of one example embodiment of a subassembly of filter 100 shown in FIG. 1. In some embodiments, the cavity of filter 100 may be defined by opposite sidewalls 122, opposite sidewalls 124, and end walls defined by end caps 130 (see FIG. 1). The cavity may have a non-cylindrical shape. A set of pleat covers 202/204 having openings therein may define two or more regions in the cavity for holding P/F elements 200. The regions can generally be cubical or rectangular-prism shaped and arranged in parallel. A gap between the regions provides a flow channel such as a center channel 220 (in embodiments with additional regions, there may be additional center channels or no center channels at all). Gaps between the outermost regions and the sidewalls of the cavity may provide additional flow channels such as side channels 210. Filter 100 can be configured so that side channels 210 and center channel 220 can act as inlet or outlet channels. Inlet and outlet channels can be sized to have a desired level of flow. Pleat covers 202 and 204 are grated or otherwise include openings so that each region is open to the adjacent channels 210 and 220.

Figure 2B:
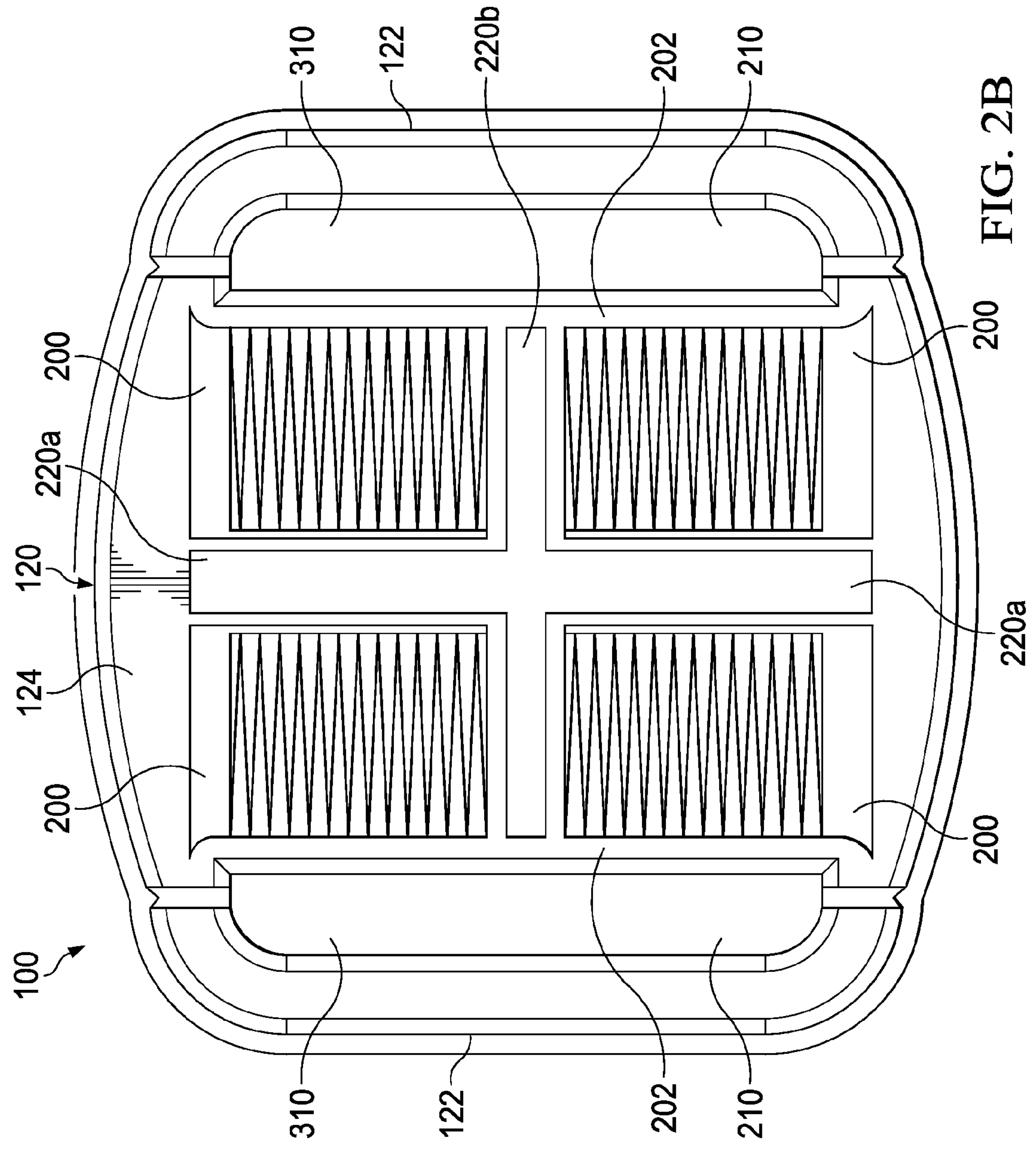
FIG. 2B depicts a front view of another example embodiment of a filter subassembly.

In the example illustrated, a set of parallel regions containing P/F elements 200 are disposed in the cavity. The regions are open to side channels 210 and center channel 220 such that the fluid can flow between the regions and channels 210/220. Skilled artisans appreciate that other arrangements may also be possible. For example, FIG. 2B depicts a front view of another example embodiment of a filter subassembly having pleat covers constructed to define multiple regions in a filter cavity for holding four P/F elements 200. The multiple regions, in this case, open to center channels 220*a*/220*b* and side channels 210.

In some embodiments, P/F elements 200 can be pleat packs of porous polymeric membrane pleated with the length of the membrane pleat parallel to the long axis of the cavity. The pleat tips may be oriented so that the pleat tips on one side abut a pleat cover 202 while the opposite pleat tips abut a pleat cover 204. This is further illustrated in FIG. 3.

Each pleat pack disclosed herein can be formed from a single membrane or multiple membranes of the same or different materials. Additionally, polymeric netting materials and other materials may be pleated with the membrane. In some embodiments, such materials can be selected to remove micron and/or submicron particles (e.g., particle size retentions of 100 nanometer or less).

In some embodiments, a pleat pack disclosed herein can have a compression ratio of about 1.0 or less. This compression ratio refers to the amount a pleat pack is compressed relative to a ratio of 1.0 in which the pleats are not separated, but are not being further compressed together. Thus, for example, a filter membrane with 100 pleats and a thickness of 0.0415 centimeters would have a width of approximately 4.15 centimeters at a compression ratio of 1.0, but a width of approximately 2.905 cm for a compression ratio of 0.7. The pleats can be compressed together and form a cube, cubical, rectangular, rectangular prism- or other non-cylindrical shaped pleat pack with a generally planar rectangular entrance interface on the upstream side and a generally planar rectangular exit interface on the downstream side. The amount of pleat compression of the membrane in a region for a given area of membrane can be selected to optimize a desired pressure drop versus flow rate.

In some embodiments, a membrane material may be pleated with a support material, such as netting. For example, the support structure can be a weave of fiber extending in a first direction and other fiber extending in a second direction that is 90 degrees relative to the first direction. As described further below, a fluid can be directed to flow through a pleat pack in a generally pleat tip-to-pleat tip direction. A pleat pack with a higher pleat height (i.e., a distance measured from pleat tip-to-pleat tip) may cause the fluid to pass through more support fibers running across the general flow path of the fluid. This, in turn, may result in more pressure drop.

More specifically, the amount of time taken for fluid particles to pass through a pleat pack (which is referred to as "residence time") may depend on the pleat height "h" (distance from pleat tip-to-pleat tip). Accordingly, two pleat packs of a certain length "L", width "W", and height "$h_1$" ($L*W*h_1$) arranged in parallel may benefit from a shorter residence time when compared with a single pleat pack of ($L*W*2h_1$). In both configurations, the media area is the same, which would lead to the expectation that the pressure drop in both configurations should be the same. However, as discussed above, in cases where the fluid may pass through more support fibers running generally perpendicular to the general flow path of the fluid, the higher pleat height "$2h_1$" may actually cause more pressure drop than the pleat height "$h_1$." Thus, in the case of the two membrane pleat packs that are arranged in parallel, the amount of the support structure is the same as the case of the single pleat pack, but the pressure drop can be reduced. This means that approximately the same overall device envelope required for a device having a pleat pack with a pleat height $2h_1$ can be used while achieving better performance (or a smaller device envelope can be used to achieve similar performance).

In some embodiments, shell 120 can act as a pressure vessel and include features to enhance pressure capability. Transitions from sidewalls 122 to 124 can be curved to distribute stress. Sidewalls 122 or 124 may be flat, arched, curved or otherwise shaped. The configuration of sidewalls 122/124 can be selected so that the von Mises stresses are less than the yield stress of shell 120. The von Mises stresses are known to those skilled in the art and thus are not further described herein.

In some embodiments, pleat covers 202 and 204 may span between facing opposite sidewalls 124. The inner pleat covers 204 may meet each sidewall 124 proximate to and on either side of the centerline of the sidewall 124. The inner pleat covers 204 can act as tension members that increase the structural integrity of shell 120 when filter 100 is pressurized.

In some embodiments, filter 100 may be formed of a plurality of single-piece and/or multi-piece filter components. In some embodiments, sidewalls 124 and pleat covers 204 may be formed of a single piece. Pleat covers 202 can be snap fit or otherwise coupled to sidewalls 124 and sidewalls 122 can be added as side covers. In some embodiments, sidewalls 124, pleat covers 202, and pleat covers 204 can be formed as a single piece and sidewalls 122 can be added as side covers. In some embodiments, sidewalls 124, pleat covers 202, pleat covers 204, and sidewalls 122 can be formed as a single piece. In some embodiments, a subassembly of filter 100 can be formed of two halves that are joined together (for example, along center channel 220). The ends of the regions and pleat packs can be potted. In some cases, this can be done as part of bonding end caps to a single or multi-piece shell 120.

Figure 3:
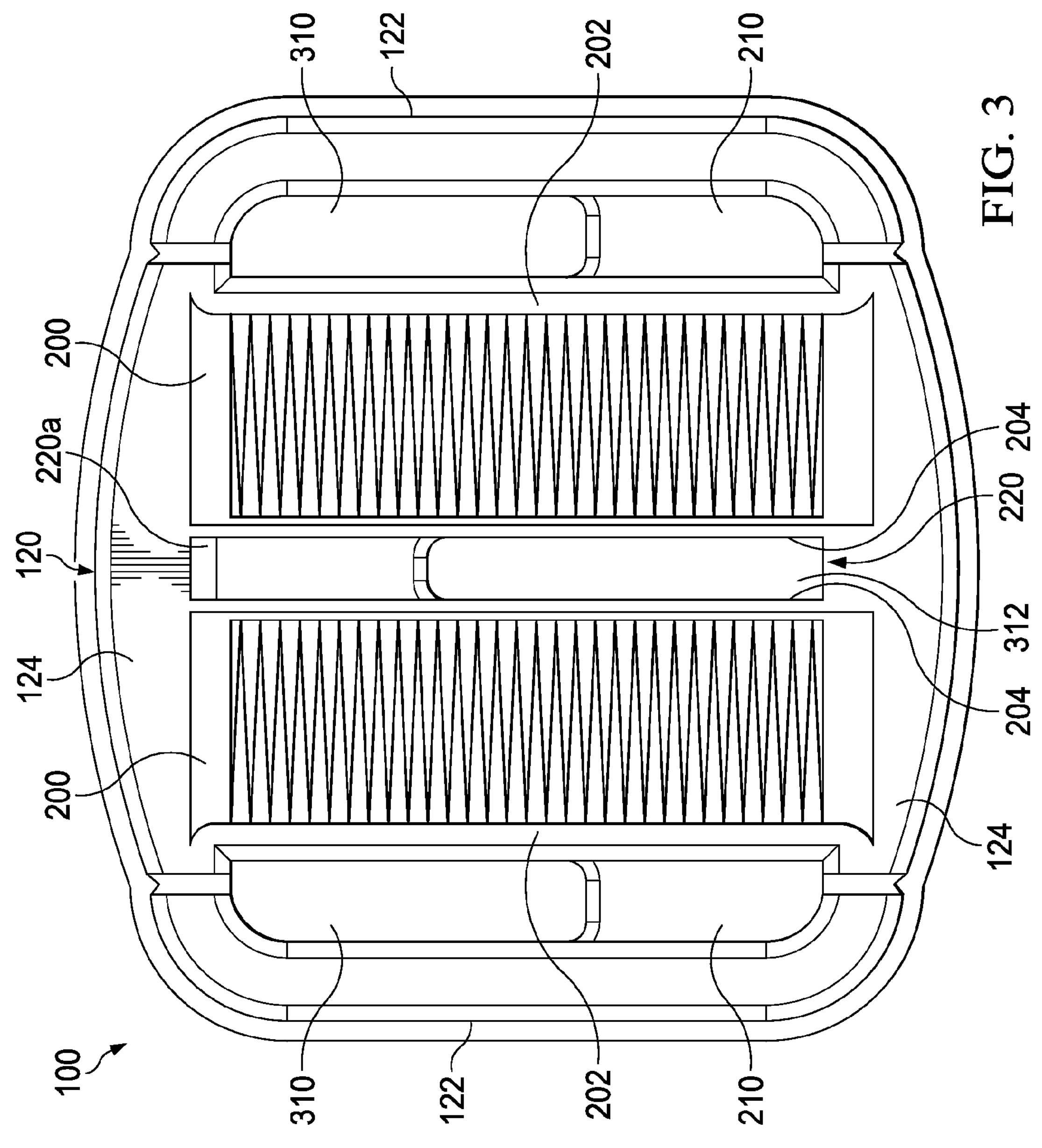
FIG. 3 depicts a front view of one example embodiment of a subassembly of the filter shown in FIG. 1.

With reference to FIG. 3, openings 310 can interface side channels 210 with flow paths that connect to a port 112 and opening 312 can interface center channel 220 with a flow path that connects to a port 112 (see FIG. 1). Similar openings may be present at the other end of filter 100, but in some cases may be arranged differently. For example, openings 310 may be at or near the top of side channels 210 at one end and at or near the bottom at the second end, while opening 312 may be at or near the top of center channel 220 at one end and at or near the bottom at the other end. In some embodiments, center channel 220 may connect to a first port 112 at one end and a second port 112 at the other end, while side channels 210 may connect to a third port 112 at one end and a fourth port 112 at the other end.

In some embodiments, an inlet port can be connected to center channel 220 at or near the bottom of center channel 220 and an inlet vent can be connected to center channel 220 at or near a high point of center channel 220. This allows for any air in an inlet channel (in the example shown, center channel 220) to escape through the vent. The outlet port can be connected at or near the bottom of side channels 210 and the outlet vent can be connected at or near the top to allow for air to escape. With the outlet connecting at or near the bottom, the outlet port can act as a drain too. In some embodiments, the outlet may be connected at or near the top of side channels 210 and may act both as a vent and an outlet. At the other end, another port may be connected to side channels 210 and act as a drain. The ports may also be connected to these flow channels (in the example shown, side channels 210 and center channel 220) at other locations. In some embodiment, some of the ports discussed may be omitted.

Filter 100 may be used for a variety of applications including, but not limited to, semiconductor manufacturing applications. In some semiconductor manufacturing processes, filters typically operate at less than 100 psi. Embodiments described herein can include a substantially polymeric filter/purifier. One embodiment can be a 100% polymeric filter/purifier. In this disclosure, an all polymeric filter can be a filter in which the fluid flow path and structural components of the filter are made of polymeric materials, without requiring, for example, metal support plates, metal mounting brackets and the like. Examples of an all polymeric filter may include a filter in which the main body and end caps are formed primarily or entirely of PFA, PTFE or other non-reactive material. In some embodiments, an all polymeric filter can be constructed to withstand burst pressures of 100 psi (0.68 MPa) or greater, including greater than 400 psi (2

MPa) and, in some cases, greater than 900 psi (6.2 MPa), in a smaller volume than required by a cylindrical filter that provides comparable retention, flow rates and pressure drop.

Skilled artisans appreciate that flow rates in filtration/purification systems are typically about 5-20 liters per minute (lpm) and filters that can handle up to 50 lpm are often used. Embodiments disclosed herein may be used for applications with a wide range of flow rates including flow rates of less than 50 lpm and flow rates of greater than 50 lpm. Furthermore, embodiments disclosed herein can provide high flow rates (e.g., greater than 15 lpm) during filtration of sub 15 nanometer particles. Embodiments disclosed herein can also be configured with other purification/filtration elements to perform other filtration and/or purification processes.

In addition, embodiments disclosed herein may exhibit a desired pressure drop. In some embodiments, a filter can be configured to have a baseline pressure drop (pressure drop with a fluid having a viscosity of 1 centipoise and no filter element installed) including, but not limited to, a baseline pressure drop of less than 30 kPa (including, in some embodiments, less than 10 kPa) at 40 liters per minute, less than 20 kPa (including, in some embodiments, less than 10 kPa) at 30 liters per minute, less than 20 kPa (including, in some embodiments, less than 10 kPa) at 20 liters per minute. Skilled artisans appreciate that the actual configuration of a filter may vary from implementation to implementation so as to balance the flow rate and the desired pressure drop.

In some embodiments, filter 100 may be configured to provide normal flow filtration (NFF), in which a fluid is directed to flow directly toward a filter membrane under applied pressure. In some embodiments, filter 100 can be configured for parallel and/or series flow through the selection of appropriate end caps. This is further explained below.

Figure 4:
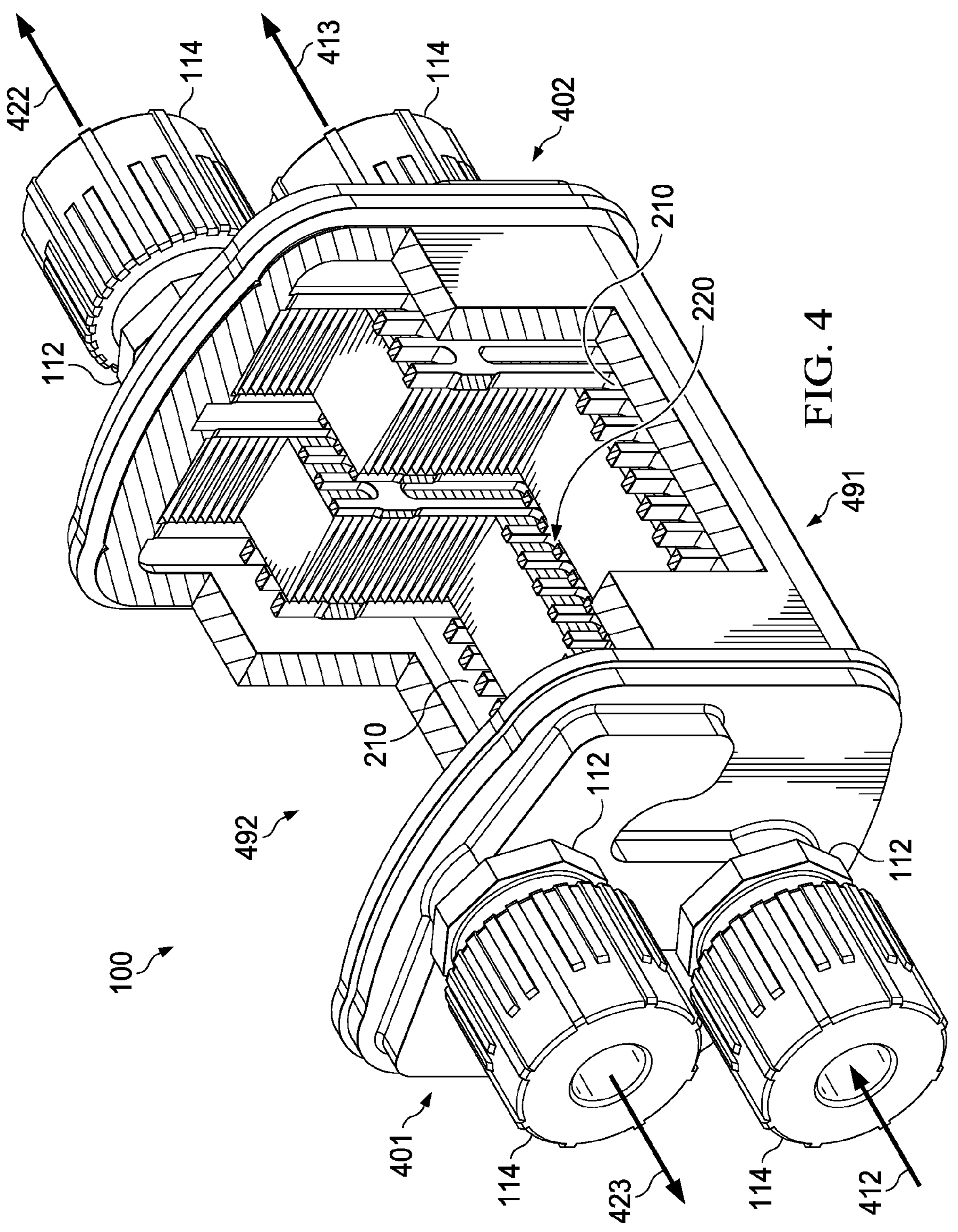
FIG. 4 depicts a diagrammatic representation of a perspective cutaway view showing interior features of one example embodiment of a filter.

FIG. 4 depicts a diagrammatic representation of a perspective cutaway view of one example embodiment of filter 100 shown in FIG. 1, with a portion removed to show interior features of filter 100. Using the reference numerals of FIGS. 1-4, center channel 220 is connected via ports 112 and fittings 114 to an inlet 412 at a first end 401 and to an inlet vent 422 at a second end 402, while side channels 210 are connected via ports 112 and fittings 114 to an outlet 413 at second end 402 and to an outlet vent 423 at first end 401.

In the example shown in FIG. 4, side channels 210 are arranged on opposite sides, at a first side 491 and a second side 492, respectively. More specifically, a first side channel 210 is connected to inlet 412 at first end 401 and to inlet vent 422 at second end 402, while a second side channel 210 is connected to outlet 413 at second end 402 and outlet vent (or drain) 423 at first end 401. These flow channels can be configured in different ways such that a fluid can be directed to flow through filter 100 using particular ports 112 as the inlet and outlet ports.

Figure 5:
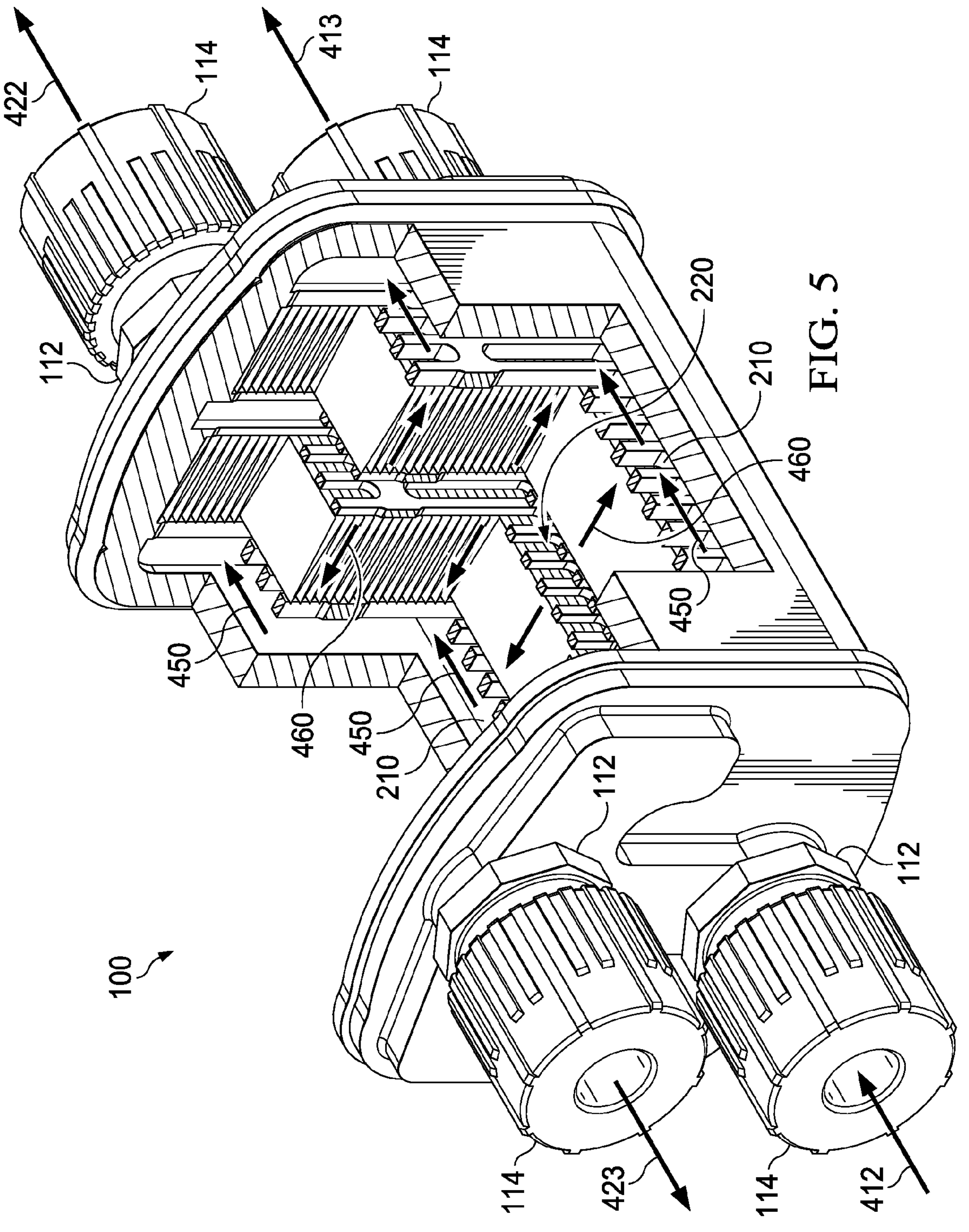
FIG. 5 depicts a diagrammatic representation of a perspective cutaway view of the filter of FIG. 4, showing parallel filtration with parallel and series flows directed from an inlet to an outlet of the filter via multiple pleat packs.

FIG. 5 depicts a diagrammatic representation of a perspective cutaway view of one example embodiment of filter 100 shown in FIG. 4, with a portion removed to show parallel and series flows directed from an inlet to an outlet of the filter via multiple pleat packs structured for parallel filtration. Using the reference numerals of FIGS. 1-5, filter 100 may receive a fluid through inlet 412 and direct the fluid to center channel 220. The fluid may flow from center channel 220 through pleat covers 204, through P/F elements 200 in parallel, to side channels 210. The fluid may then flow in series from side channels 210 to outlet 413. As illustrated in FIG. 5, in this example, the fluid flows from center channel 220 through P/F elements 200 in a pleat tip-to-pleat tip direction such that the fluid is directed, via parallel flows 460, to side channels 210 and then, via series flows 450, to outlet 413.

Those skilled in the art appreciate that FIG. 5 illustrates a non-limiting example of parallel filtration with parallel flows and series flows. Other flow paths to provide for parallel filtration in a filter disclosed herein may be possible. For example, end caps 130 may define particular flow passages such that filter 100 receives a fluid through inlet 412 and the fluid is directed (e.g., via the flow passages defined in end caps 13) to side channels 210 first. The fluid flows from side channels 210 through P/F elements 200 in a pleat tip-to-pleat tip direction such that the fluid is directed, via parallel flows, to center channel 220 and then, via series flows, to outlet 413.

Figure 6:
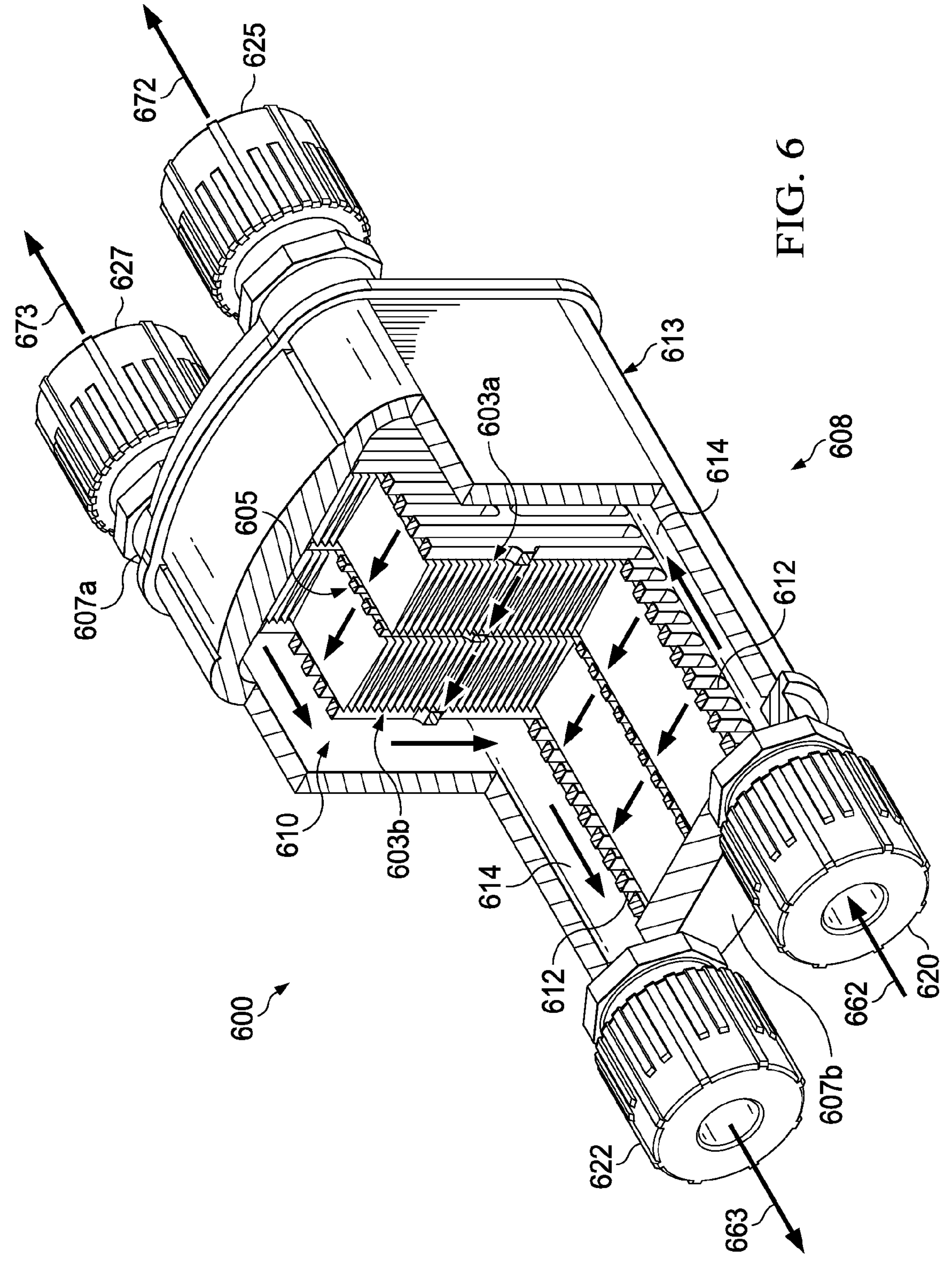
FIG. 6 depicts a diagrammatic representation of a perspective cutaway view showing interior features of one example embodiment of a filter structured for series filtration.

FIG. 6 depicts a diagrammatic representation of a perspective cutaway view of one example embodiment of a filter structured for series filtration. As a non-limiting example, filter 600 may include a body 608 that provides an internal cavity 610 containing pleat packs 603*a* and 603*b*. When assembled, body 608 can be completely sealed. Ports (e.g., with fittings 620, 622, 625, 627) can provide openings for fluid ingress to and egress from cavity 610. Body 608 can have a generally cubical, cuboid, rectangular prism shape or other non-cylindrical shape. Any number of pieces may be used to form body 608. In some embodiments, a single or multi-piece shell 613 may form the sidewalls of body 608 and end caps 607*a*, 607*b* may be bonded or otherwise joined to the ends of shell 613 to form the end walls. Suitable manufacturing methods and materials for filter 600 may be similar to or the same as those described above with respect to filter 100.

In some embodiments, filter 600 can include outer pleat covers 612 and a separator 605 (which serves as a center pleat cover). The regions thus formed by pleat covers 612 and separator 605 can be generally cubical or rectangular-prism shaped. As illustrated in FIG. 6, gaps between pleat covers 612 and the sidewalls of cavity 610 may form side channels 614. In some embodiments, filter 600 can be configured such that side channels 614 can act as inlet and outlet channels. Such inlet and outlet channels can be sized or otherwise dimensioned to provide a desired level of flow. In some embodiments, pleat covers 605/612 are grated or otherwise include openings so that the regions are open to adjacent side channels 614 and fluid can flow from one region to the next through separator 605. Pleat covers 612 and separator 605 may span or otherwise extend between two end caps 607*a*, 607*b* inside cavity 610.

In some embodiments, filter 600 can include P/F elements comprising pleat packs 603*a*, 603*b* positioned in the aforementioned regions and separated by separator 605, as shown in the example of FIG. 6. Pleat packs 603*a* and 603*b* may be compressed as discussed above. Separator 605 may be configured as a floating object between pleat packs 603*a* and 603*b* such that it can float to a location based on the membrane pleat height. Separator 605 may be held in place by pleat packs 603*a* and 603*b* abutting it or through the use of alignment features on shell 613 and/or end caps 607. In some embodiments, separator 605 may have a fixed location.

The fixed or floating location of separator 605 can vary based on filtration and flow configurations. In some embodiments, a smaller pleat and less membrane for higher pore size membrane may be used. In some embodiments, a larger pleat height and more membrane may be used for a tighter membrane to match flow. For example, the height of pleat packs 603*a* and 603*b* may be selected and separator 605 may be located in the middle between them or, if one membrane's height is higher than the other, then separator 605 may be situated offset from the middle—separator 605 does not always have to be centrally located as shown in FIG. 6. One advantage of having separator 605 is that pleat packs 603*a* and 603*b* of different membrane media may be used in filter 600. Furthermore, depending on the location of separator 605, the height of the membrane media can also be varied.

In some embodiments, ports are arranged as needed on body 608 for the ingress and egress of fluid. Fittings 620, 622, 625, 627 may connect the ports to other components of a filtration/purification system that deliver fluid to/from filter 600. In the arrangement illustrated, the ports are disposed on end caps 607*a* and 607*b*. Similar to end caps 130 described above, end caps 607*a* and/or 607*b* may include flow passages particularly defined to direct a fluid from an inlet 662 to appropriate locations in cavity 610 and out to an outlet 663. While four ports are illustrated in FIG. 6, filter 600 may have more or fewer ports. In some embodiments, one or more of the ports may be arranged elsewhere, such as on shell 613. Furthermore, while inlet 662 and outlet 663 are shown in FIG. 6 as being located on the same side, they can be arranged on opposite sides of filter 600.

In operation, at least one port may act as an inlet port and at least one port may act as an outlet port. In the example illustrated, filter 600 may receive a fluid through inlet 662 and the fluid is directed (e.g., via a flow passage defined in end cap 607*b*) to first side channel 614. The fluid flows from first side channel 614, through P/F elements in cavity 610 (through first pleat cover 612, pleat pack 603*a*, separator 605, pleat pack 603*b*, and second pleat cover 612) to second side channel 614. The filtered/purified fluid is then directed to flow from second side channel 614 to a downstream component or components through outlet 663. In this way, the fluid flows from one side channel 614 to another side channel 614 such that the fluid is serially filtered and/or purified through pleat packs 603*a* and 603*b*. In some embodiments, vents (e.g., inlet vent 672 and outlet vent 673) may be arranged at or near the top of shell 613 (i.e., at the highest possible location relative to body 608) to allow air to escape from filter 600. As discussed above, in some embodiments, inlet 662 and outlet 663 may be located on opposite sides of filter 600. Thus, flow passages defined in end caps 607*a* and 607*b* may provide a flow path for series filtration in which a fluid is directed to flow from inlet 662 located at a first end of filter 600 to first side channel 614, through first pleat cover 612, pleat pack 603*a*, separator 605, pleat pack 603*b*, and second pleat cover 612, to second side channel 614, and then to outlet 663 located at a second end of filter 600 opposite the first end.

In some embodiments, the media of pleat packs 603*a* and 603*b* may be seamed together so that the media is one continuous piece as discussed in greater detail below with respect to FIGS. 7B and 7C. Separator 605 may be inserted in between the continuous membrane pleat. In some embodiments, the media of pleat packs 603*a* and 603*b* may be different.

Figure 7A:
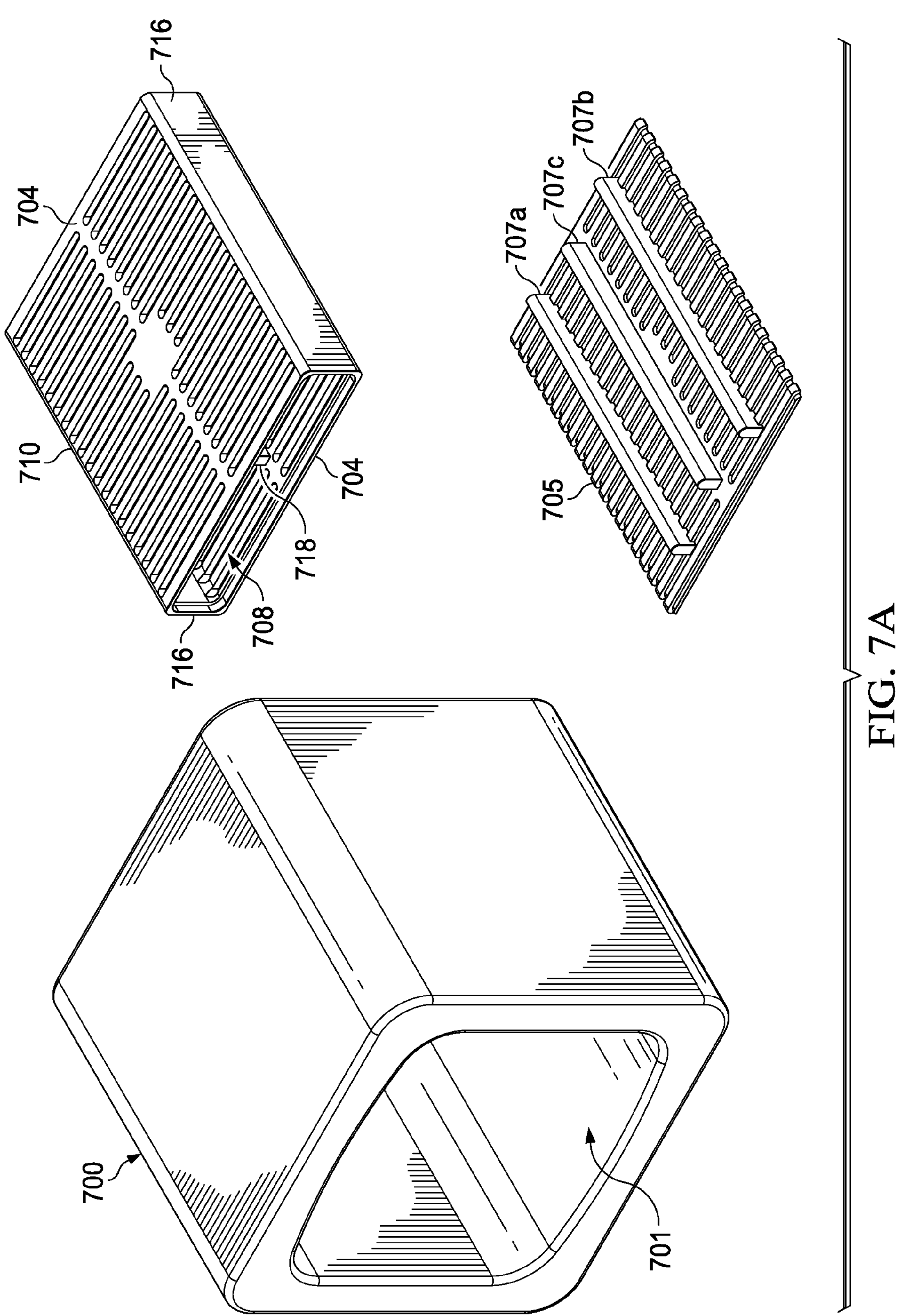
FIGS. 7A-7G depict diagrammatic representations of various views of one example embodiment of a filter and components thereof.
Figure 7B:
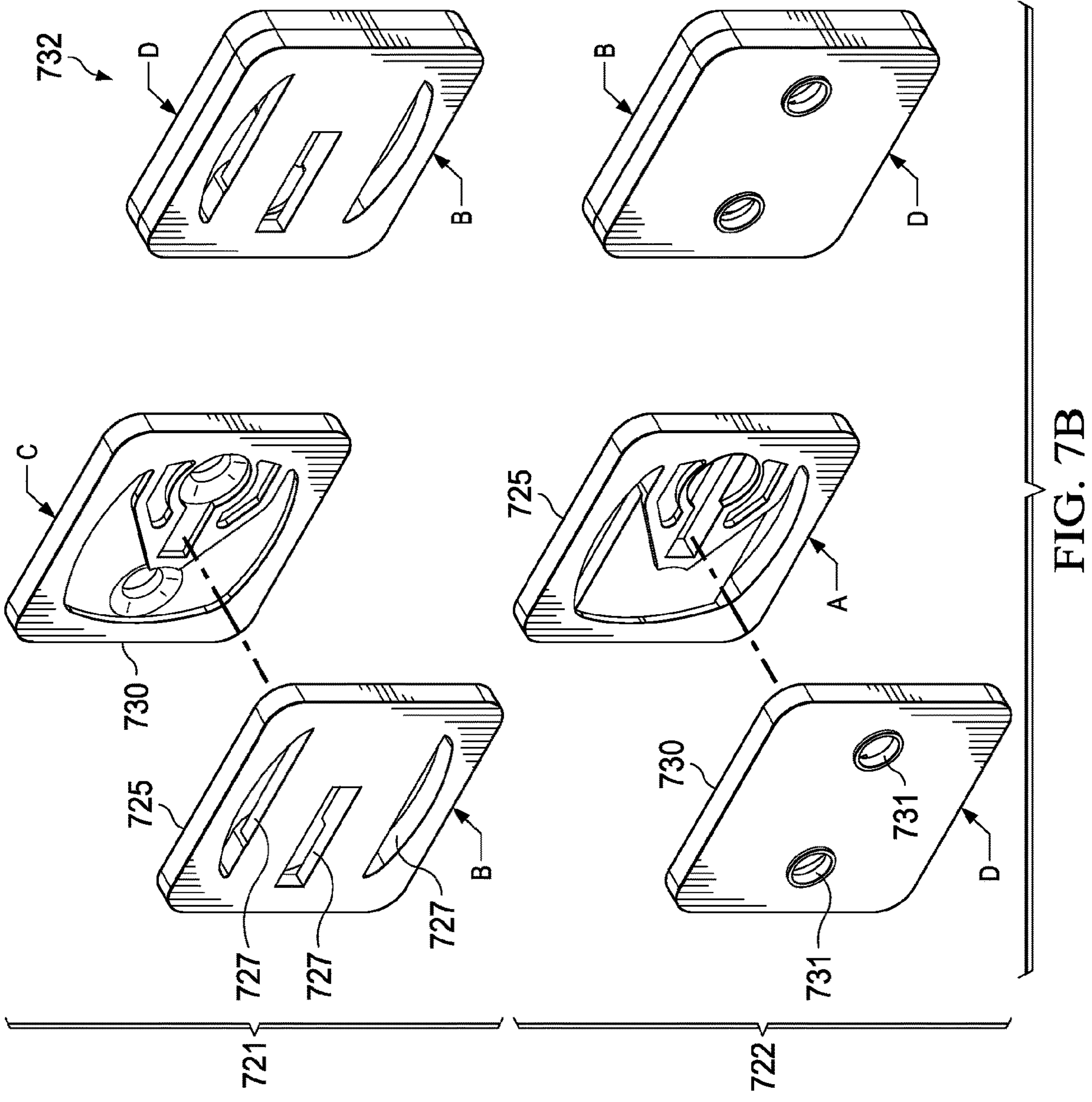
Figure 7D:
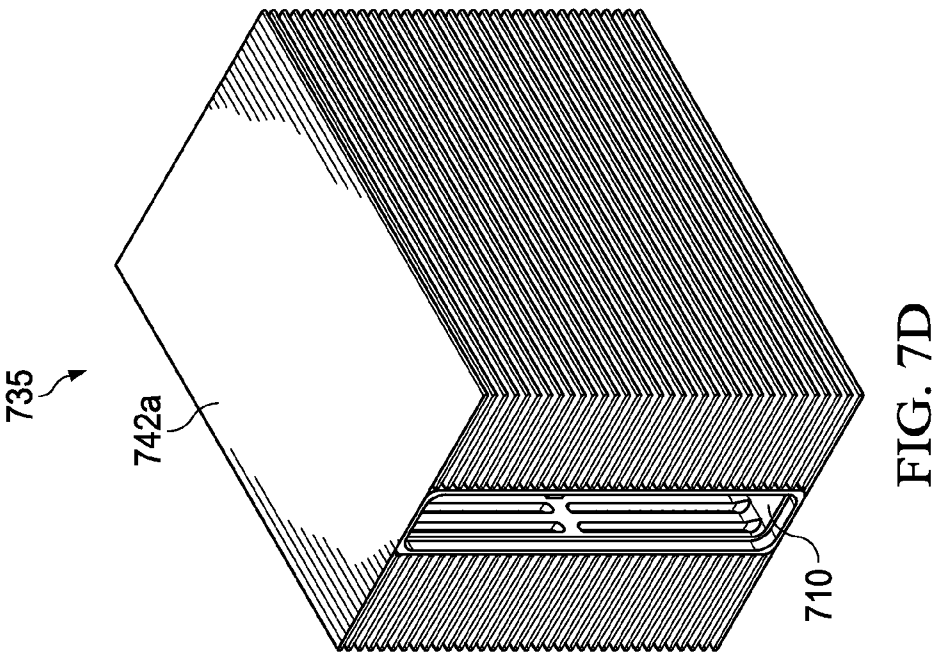
Figure 7C:
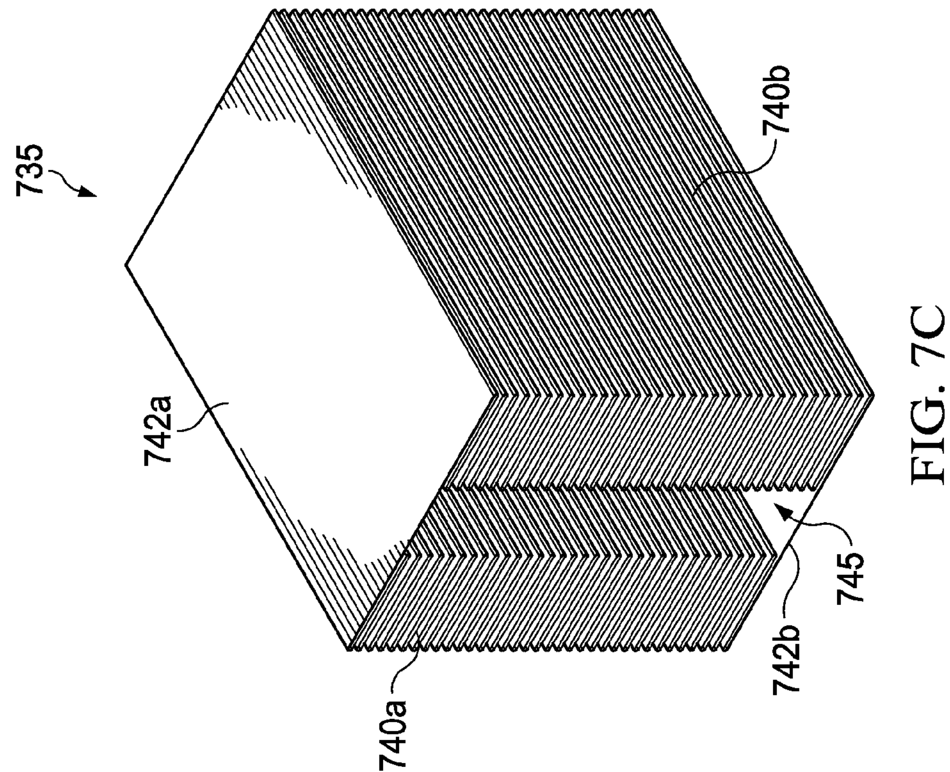
Figure 7E:
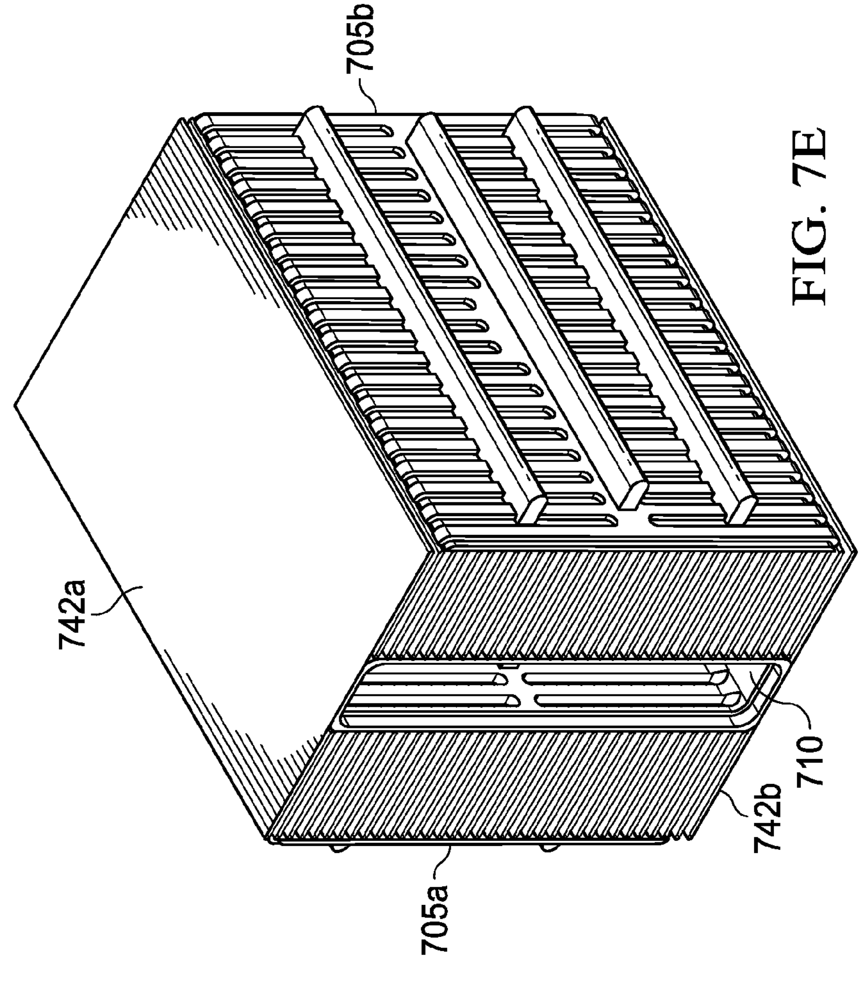
Figure 7F:
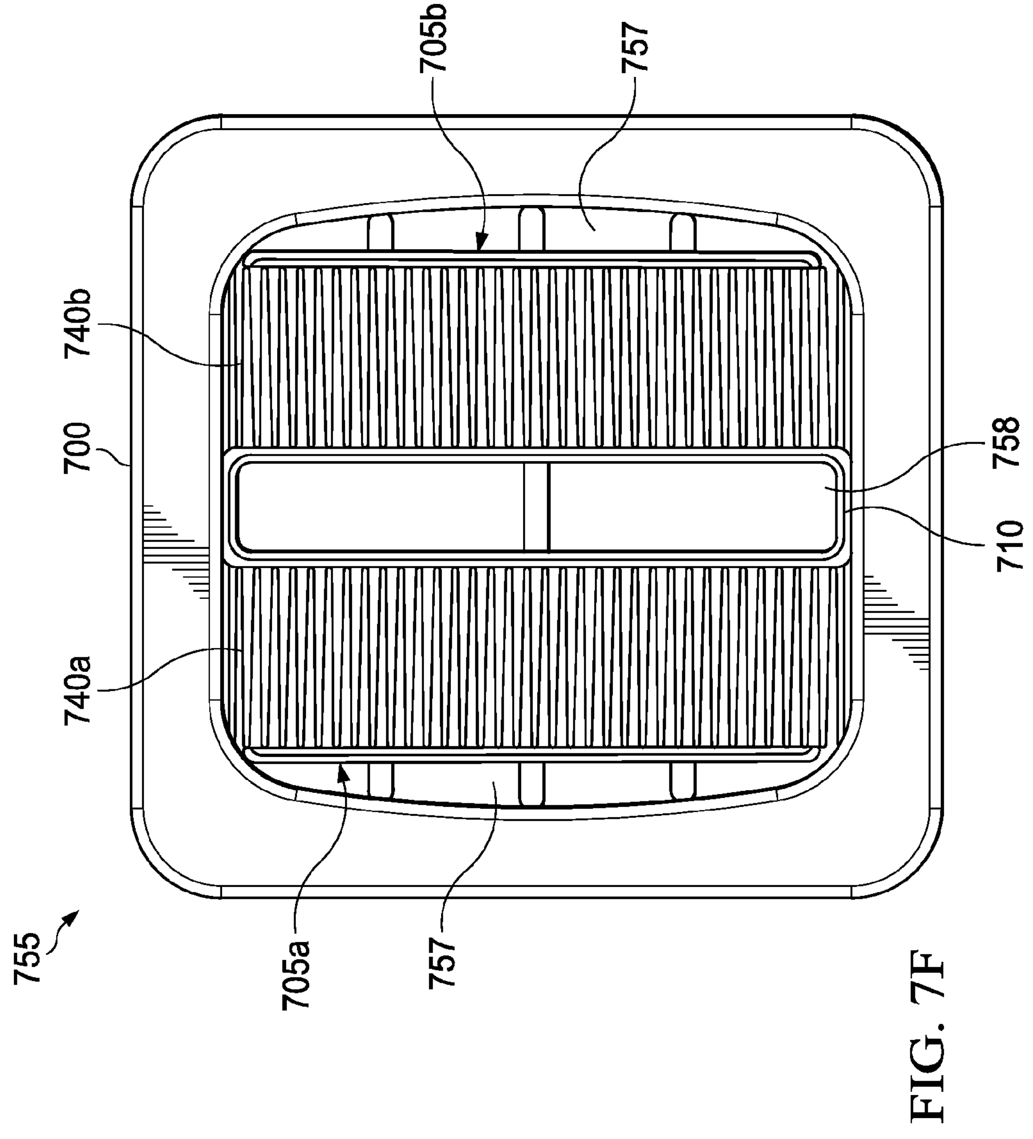
Figure 7G:
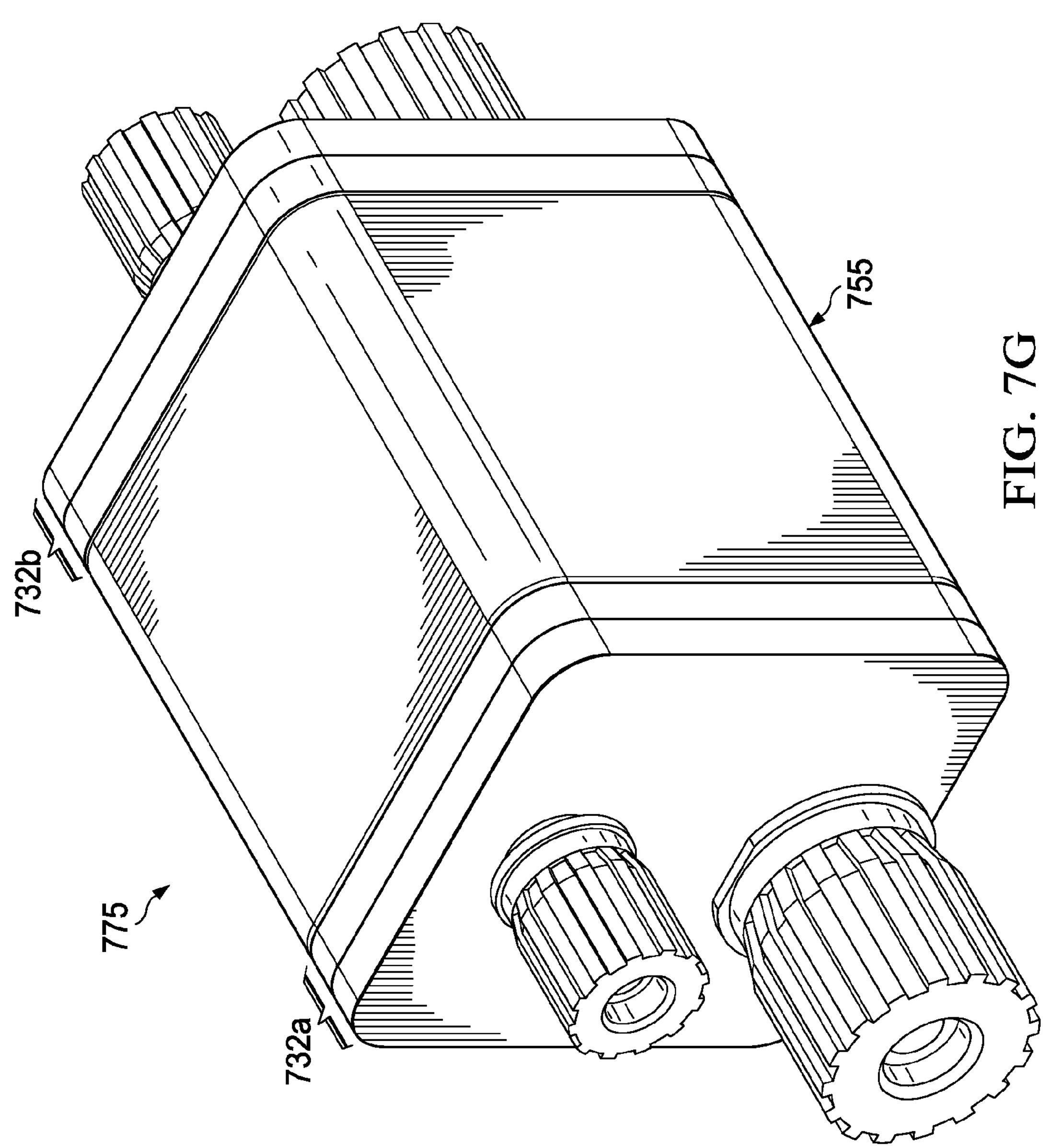

FIGS. 7A-7G depict diagrammatic representations of various views of one example embodiment of a filter and components thereof. More specifically, FIGS. 7A-7E depict exploded views of filter components, FIG. 7F depicts a front view of a filter subassembly 755, and FIG. 7G depicts a perspective view of a filter 775 assembled from filter components shown in FIGS. 7A-7G according to an assembly process described below.

In the example shown in FIG. 7A, filter components may include a shell 700 defining a cavity 701, two outer pleat covers 705 (only one is shown), and an inner pleat cover structure or cage 710. Subassembly 755 may be sized or otherwise dimensioned to fit inside cavity 701. Each outer pleat cover 705 may comprise one or more standoffs or protrusions. As shown in FIG. 7A, multiple standoffs or protrusions 707*a*-707*c* may extend from a surface of pleat cover 705. Protrusions 707*a*-707*c* may be of same height or of different heights, depending upon an application or a shape of cavity 701 of shell 700. For example, protrusion 707*c* can be of a greater height than the heights of protrusions 707*a*, 707*b*. And two protrusions 707*a* and 707*b* can be of the same height.

Cage 710 may comprise spaced pleat covers 704 separated by first and second walls 716. One or more additional members (e.g., member 718) may be positioned in between pleat covers 704 to provide additional structural support. In some embodiments, first and second walls 716 may extend along the length of pleat covers 704. In some embodiments, first and second walls 716 may be solid. Pleat covers 704 and walls 716 form an inner channel 708 that is open on at least one end of cage 710. Channel 708 may extend along the length of cage 710. In some embodiments, channel 708 may be open on both ends of cage 710.

The filter end caps described above (including end caps 130 and 607) may include multiple portions. Referring to FIG. 7B, in some embodiments, an end cap 732 may be formed of two parts: a potting end cap 725 on a first side (e.g., Side B) and a fitting end cap 730 on a second side (e.g., Side D). Potting end cap 725 provides openings 727 that interface with the inlet/outlet channels in the filter cavity. Perspective views 721 and 722 show both sides (Side A and Side B) of potting end cap 725 and both sides (Side C and Side D) of fitting end cap 730. Fitting end cap 730 provides ports 731 to which fittings can be coupled. Potting end cap 725 and/or fitting end cap 730 can comprise indented features defining particular flow passages such that, after potting end cap 725 and fitting end cap 730 are bonded or otherwise coupled together to form end cap 732, the flow passages defined in end cap 732 can connect ports 731 of fitting end cap 730 to the appropriate openings 727 of potting end cap 725.

FIGS. 7C and 7D illustrate a representative embodiment of a P/F element 735 with a continuous pleat pack formed of a first pleat pack 740*a*, a second pleat pack 740*b*, and bridges 742*a* and 742*b* connecting or otherwise joining first pleat pack 740*a* and second pleat pack 740*b*. While slight spacing is shown between adjacent pleats in first pleat pack 740*a* and second pleat pack 740*b*, this is done for purposes of illustration. Pleat packs 740*a* and 740*b* may be compressed as discussed above (e.g., each of pleat packs 740*a* and 740*b* can have a compression ratio of 1.0 or less). In the example illustrated, pleat packs 740*a* and 740*b* are spaced from each other with the respective inner set of pleat tips facing each other, forming a channel 745 between pleat packs 740*a* and 740*b*. P/F element 735 can be configured such that channel 745 can accommodate one or more pleat covers (e.g., separator 605, cage 710, etc.). As illustrated in FIG. 7D, in one embodiment, the inner pleat tips of pleat packs 740*a* and 740*b* can abut each side of cage 710 inserted or otherwise positioned in channel 745.

In some embodiments, P/F element 735 may be formed by joining two separate pleat packs together via bridges 742*a* and 742*b*. As such, pleat packs 740*a* and 740*b* can be made of the same or different materials with the same or different filtration properties. In some embodiments, a membrane (and/or a support material) may be pleated so that particular pleats or flaps are longer. For example, the filter element material can be pleated with i) longer end flaps, ii) sections of pleats to form pleat packs 740*a* and 740*b* and/or iii) a longer center pleat. The filter element material can be arranged so that the longer center pleat is unfolded to form bridge 742*a* and the end flaps can be seamed to form bridge 742*b*.

While bridges 742*a* and 742*b* are shown at end pleats of pleat packs 740*a* and 740*b*, bridges may also be formed at other areas between pleat packs 740*a* and 740*b*. In this way, additional parallel pleat packs can be disposed above and below the bridged location(s). Referring to FIG. 2B, such parallel pleat packs may be suitable for implementing P/F elements 200.

Referring to FIG. 7E, cage 710 may be inserted between pleat packs 740*a* and 740*b*. Prior to forming subassembly 755 shown in FIG. 7F, pleat covers 705*a* and 705*b* may be coupled to pleat packs 740*a* and 740*b*, respectively. After P/F element 735, which is coupled to pleat covers 705*a* and 705*b* and which has cage 710 positioned in between pleat packs 740*a* and 740*b* and bridges 742*a* and 742*b*, is positioned in shell 700, bridges 742*a* and 742*b* are captured between shell 700 and inner cage 710. As illustrated in FIG. 7F, either end of pleat covers 705*a* and 705*b* can be held (e.g., by a fixture) inside shell 700. Protrusions 707*a*-707*c* (see FIG. 7A) of each outer pleat cover 705 can cause outer pleat cover 705 to push against the walls of shell 700 and pleat packs 740*a* and 740*b*. The gap between protrusions 707*a*-707*c* of outer pleat covers 705 and shell 700 form side channels 757 of subassembly 755. In the example shown, channel 708 of cage 710 (see FIG. 7A) can form a center channel 758 of subassembly 755.

Where appropriate, excess membrane of pleat packs 740*a* and 740*b* can be trimmed at this time. As illustrated in FIG. 7G, a first end cap 732*a* (e.g., formed of a fitting end cap and a potting end cap as described above) and a second end cap 732*b* (e.g., formed of a fitting end cap and a potting end cap as described above) can then be bonded or otherwise coupled to subassembly 755 to complete the assembly of filter 775.

Figure 8:
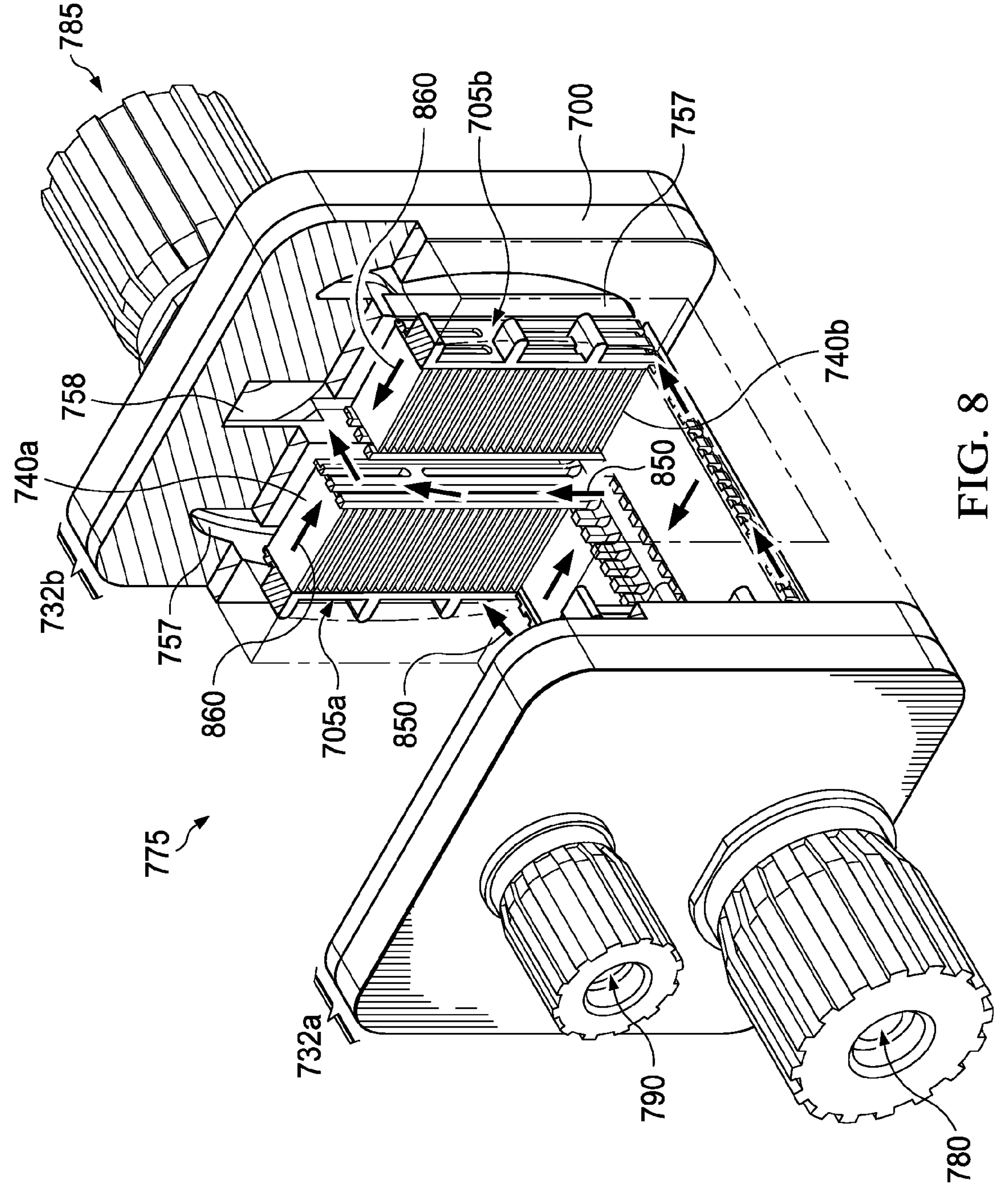
FIG. 8 depicts a diagrammatic representation of a perspective cutaway view of one example embodiment of a filter with a portion removed to show parallel and series flows directed from an inlet to an outlet of the filter via multiple pleat packs.

FIG. 8 depicts a diagrammatic representation of a perspective cutaway view of one example embodiment of filter 775 configured for parallel filtration with parallel flows 860 and series flows 850 directed from an inlet port 780 to an outlet port 785 via multiple pleat packs (e.g., pleat packs 740*a* and 740*b* shown in FIG. C). As a non-limiting example, FIG. 8 shows, via solid arrows, a flow path of a fluid in filter 775. The fluid enters filter 775 via inlet port 780 and exits via outlet port 785. Filter 775 further includes an outlet vent 790 and an inlet vent (not shown). As described above, end caps 732*a* and 732*b* may be configured to provide multiple fluid flow options based on end connections used. For example, similar to embodiments described above with reference to FIGS. 4 and 5, filter 775 can also be configured for series filtration in which a fluid is directed to flow from inlet port 780 to a first side channel, through multiple pleat packs (with or without a separator and/or a center channel in between the pleat packs), to a second side channel and then to outlet port 785. According to embodiments, inlet port 780 and outlet port 785 can be arranged so that they are located on the same side or on opposite sides of filter 775. Skilled artisans appreciate that end cap 732*a*, end cap 732*b*, or both, can be structured accordingly to define flow passages appropriate for parallel filtration, series filtration, and/or the particular configuration of the ports (e.g., location, type, and/or number of the ports for an implementation of filter 775).

Figure 9A:
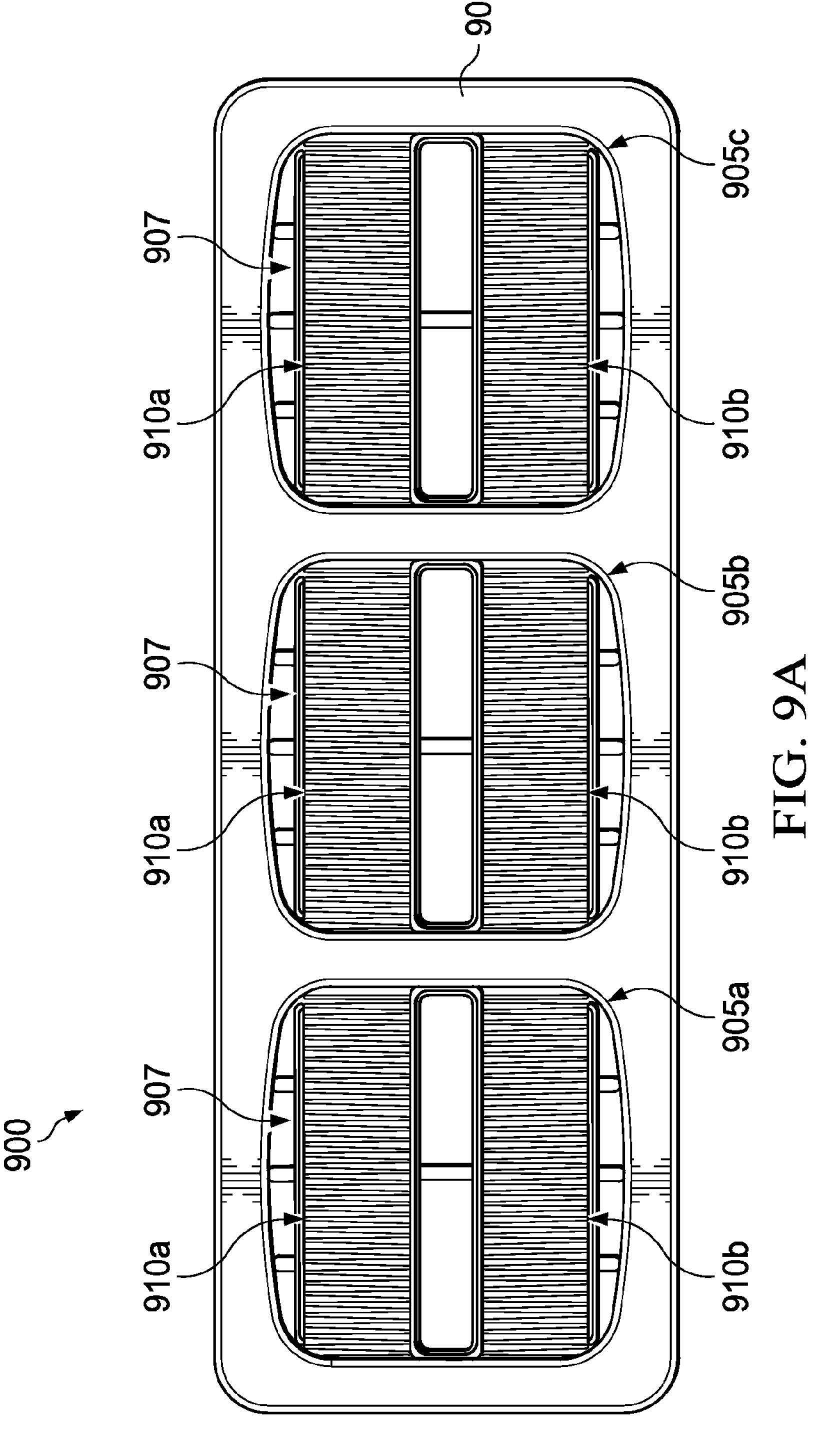
FIG. 9A depicts a diagrammatic representation of a front view of one example embodiment of a filter having a body with multiple cavities for a plurality of P/F elements.

In representative embodiments of a filter described above, the filter has a single internal cavity to accommodate a subassembly comprising multiple pleat packs. Skilled artisans appreciate that various configurations of filter components described above may be employed to form multiple subassemblies in a single shell or body. FIG. 9A depicts a diagrammatic representation of a front view of one example embodiment of a filter having a body with multiple cavities for a plurality of P/F elements.

In FIG. 9A, a filter 900 may include a single shell 903 that has multiple cavities 905*a*-905*c* for a plurality of P/F elements 907. The body of shell 903 can be constructed from a single piece or from multiple pieces. Each cavity may be sized or otherwise dimensioned to accommodate a subassembly (e.g., subassembly 755 described above). Each such subassembly may include a P/F element 907 having first and second pleat packs 910*a* and 910*b*, which can be similar to pleat packs 740*a* and 740*b* described above. FIGS. 9B, 9C, 9D, and 9E illustrate by example that single pleat pack (e.g., pleat pack 910) or multiple pleat packs (e.g., pleat packs 910*a* and 910*b*) can be positioned in the multiple cavities (e.g., cavities 905*a*-905*c*) of filter 900 and oriented in the same directions (see, e.g., FIGS. 9A, 9B, 9D, and 9E) or different directions (see, e.g., FIG. 9C).

Other combinations of pleat packs with various orientations are also possible. Such configuration flexibility allows embodiments of filter 900 to accommodate various port arrangements and/or flow requirements. For example, in some embodiments, one or more P/F elements may be positioned in a plurality of cavities in a single shell. Each P/F element may have a single or multiple pleat packs. Various types of P/F elements may be used. As illustrated in FIGS. 9D and 9E, a P/F element may or may not include a cage described above. Furthermore, a P/F element may be made of a single pleated membrane. In the example shown in FIG. 9D, P/F element 907 in cavity 905*a* has pleat packs 910*a* and 910*b* supported by a set of pleat covers similar to those described above. Additionally, P/F element 907 in cavity 905*b* has a single pleat pack 910 and P/F element 907 in cavity 905*c* has a single pleat pack 910, both of which are also supported by a set of pleat covers. Other combinations of single/multiple pleat packs in multiple cavities of a single shell may also be possible. Furthermore, such single/multiple pleat packs may be oriented in the same or different directions. As illustrated in FIG. 9E, pleat packs 910, 910*a*, and 910*b* may be positioned in cavities 905*a*-905*c* in various ways based on flow requirements and/or the type of filtration/purification desired (e.g., parallel filtration and/or series filtration). Although not shown in FIG. 9E, skilled artisans appreciate that pleat packs 910, 910*a*, and 910*b* may be oriented in cavities 905*a*-905*c* in different directions to accommodate the locations of ports (e.g., inlet ports, outlet ports, vent ports, drain ports, etc.).

Figure 9B:
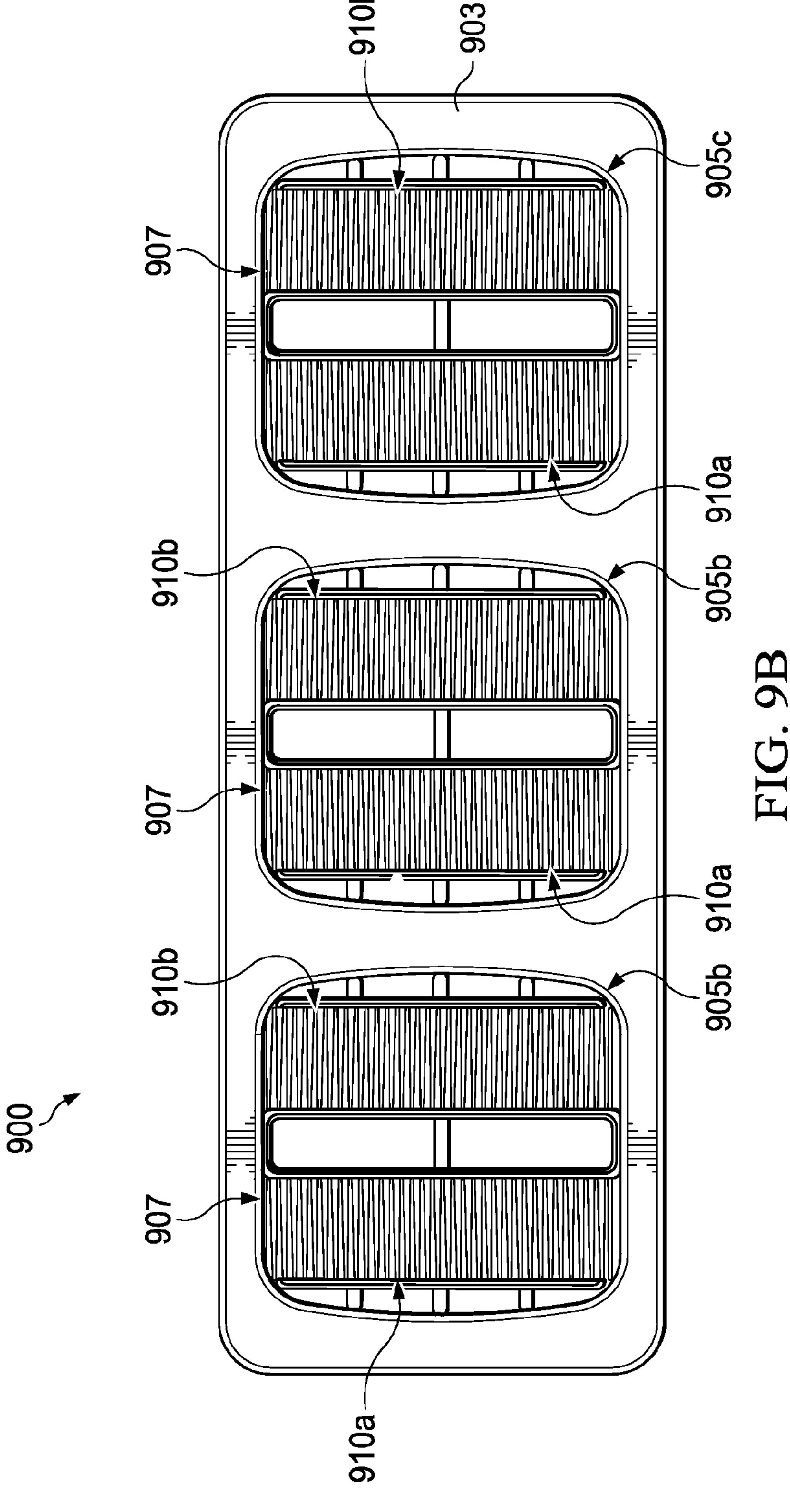
FIG. 9B depicts a diagrammatic representation of a front view of another example embodiment of a filter having a body with multiple cavities for a plurality of P/F elements.
Figure 9C:
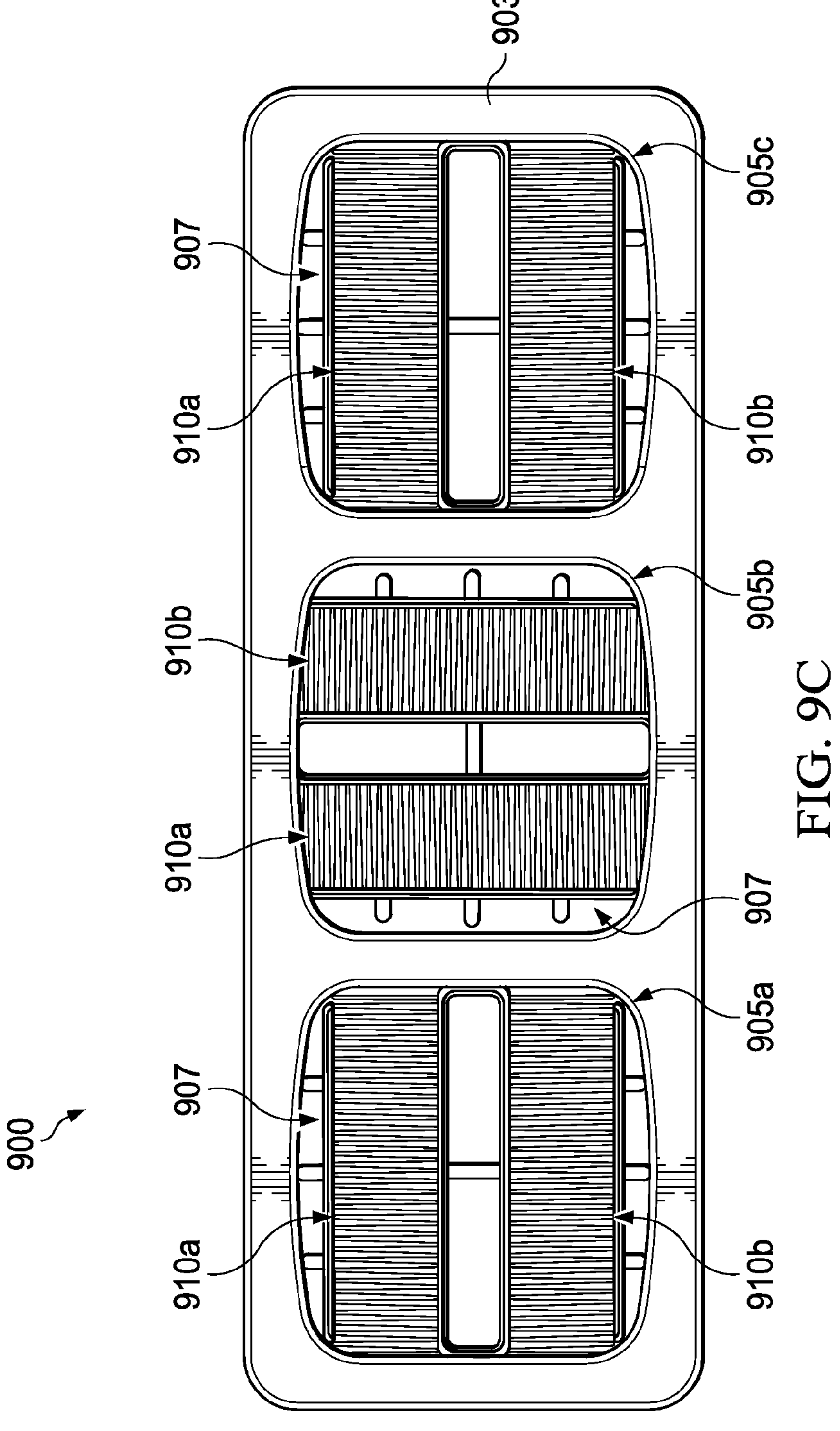
FIG. 9C depicts a diagrammatic representation of a front view of yet another example embodiment of a filter having a body with multiple cavities for a plurality of P/F elements.
Figure 9D:
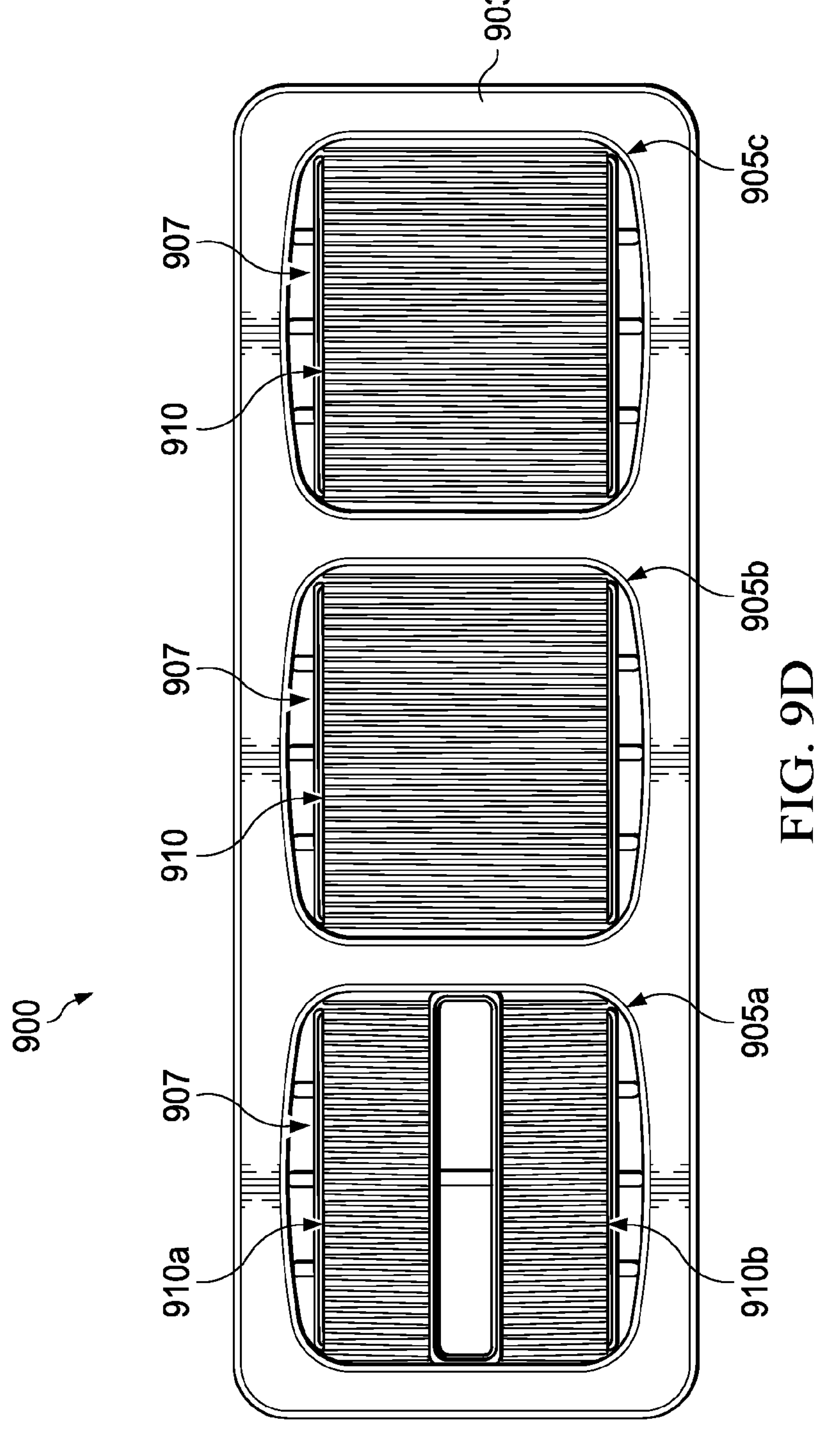
FIG. 9D depicts a diagrammatic representation of a front view of another example embodiment of a filter having a body with multiple cavities for a plurality of P/F elements.
Figure 9E:
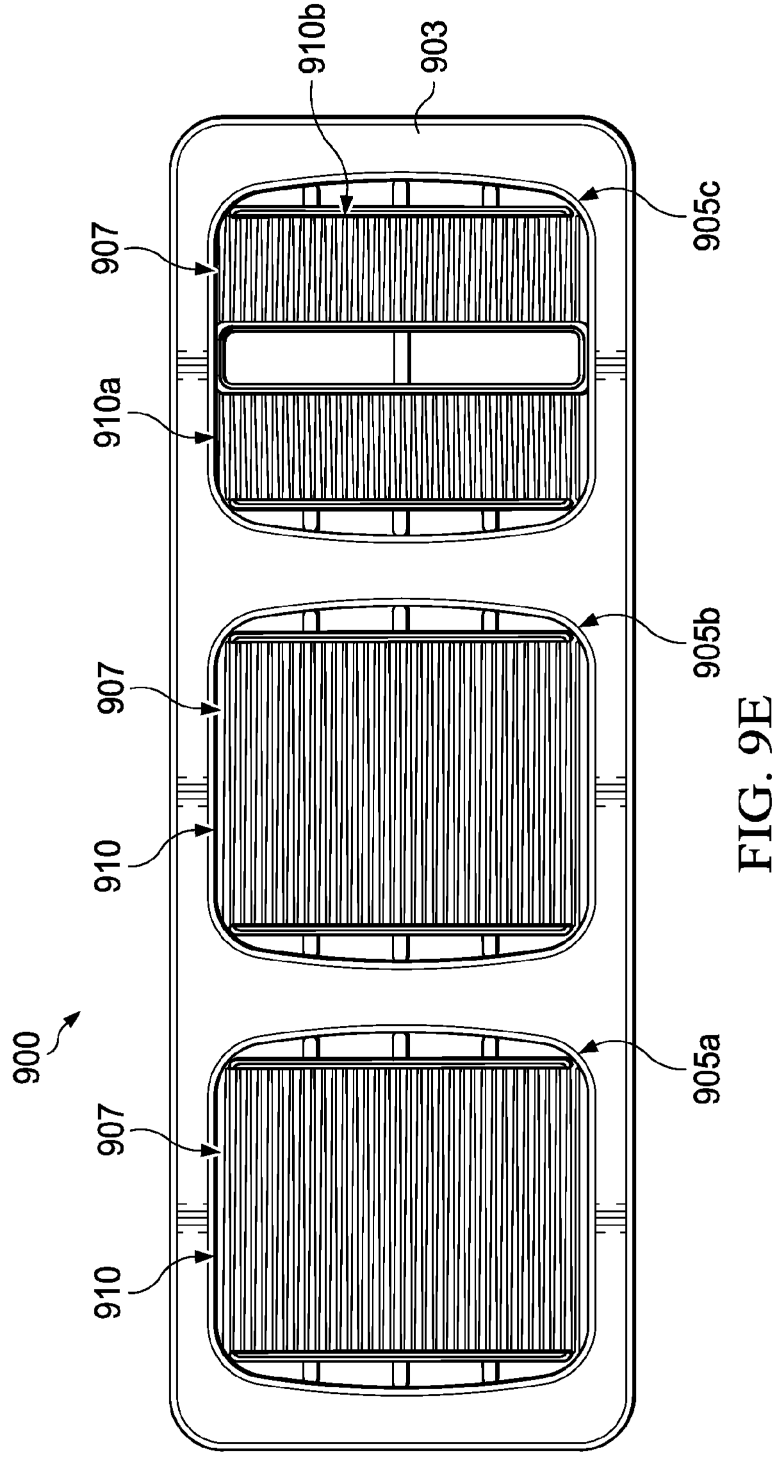
FIG. 9E depicts a diagrammatic representation of a front view of yet another example embodiment of a filter having a body with multiple cavities for a plurality of P/F elements.
Figure 9F:
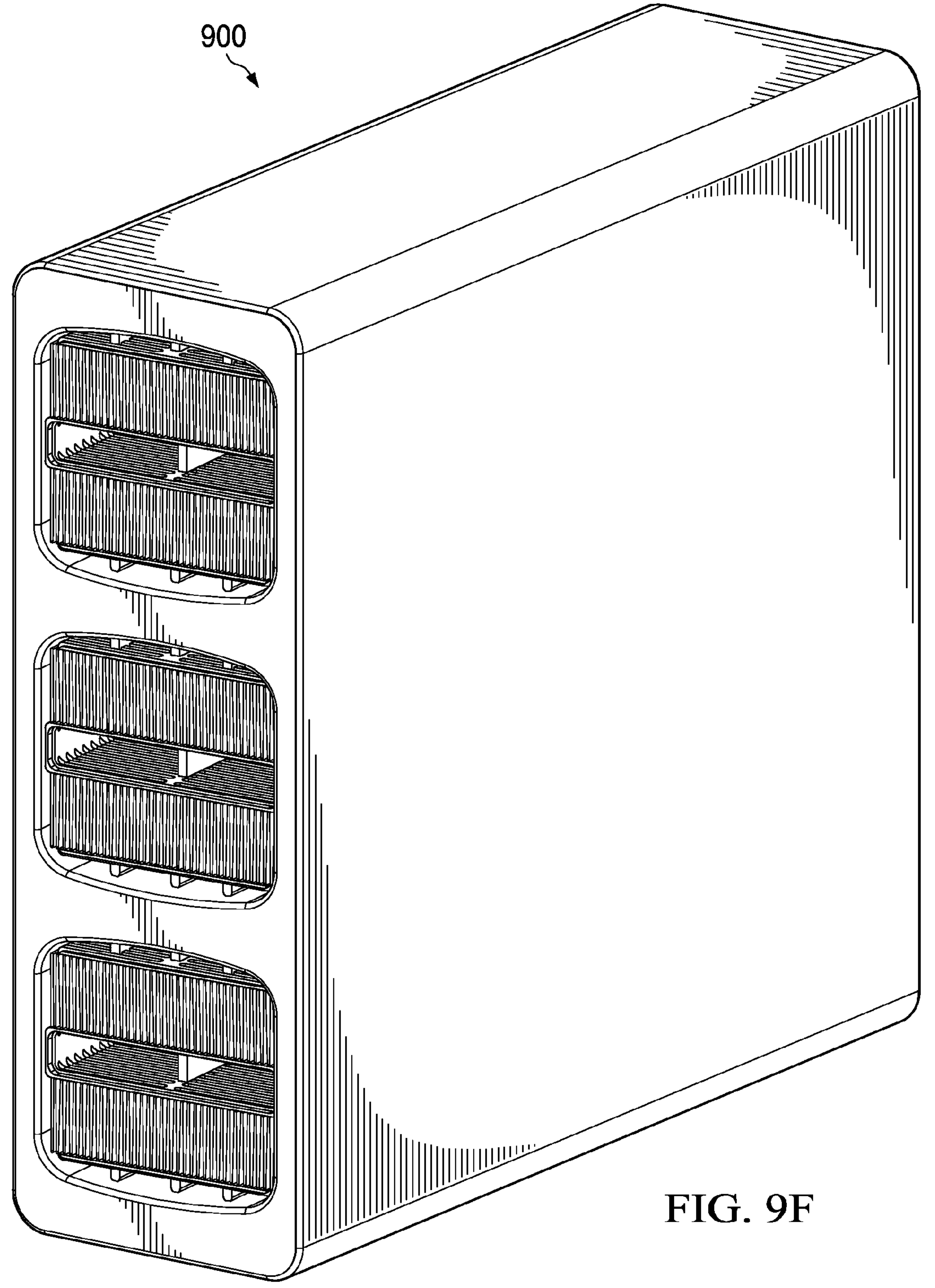
FIG. 9F depicts a diagrammatic representation of a perspective view of the filter shown in FIG. 9B.
Figure 9G:
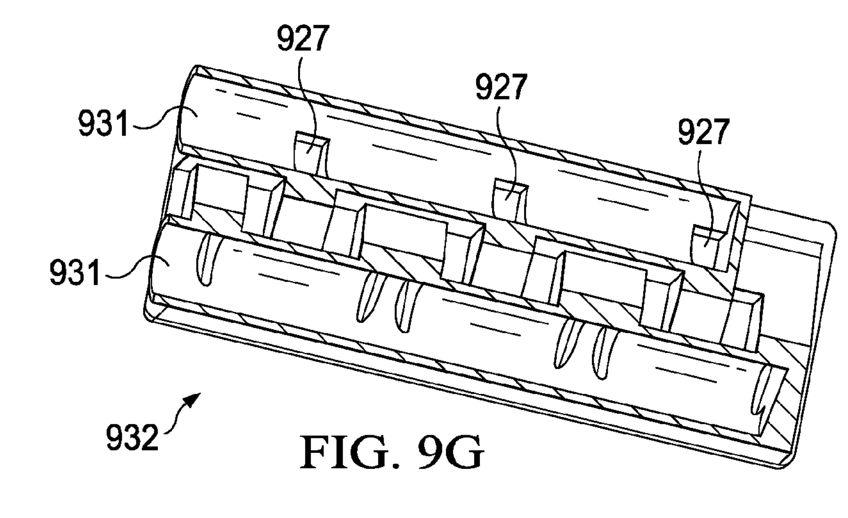
FIG. 9G depicts a diagrammatic representation of a perspective cutaway view of one example embodiment of an end cap for a filter having a body with multiple cavities for a plurality of P/F elements.
Figure 9H:
FIG. 9H depicts a diagrammatic representation of a perspective view of the end cap shown in FIG. 9G.
Figure 9I:
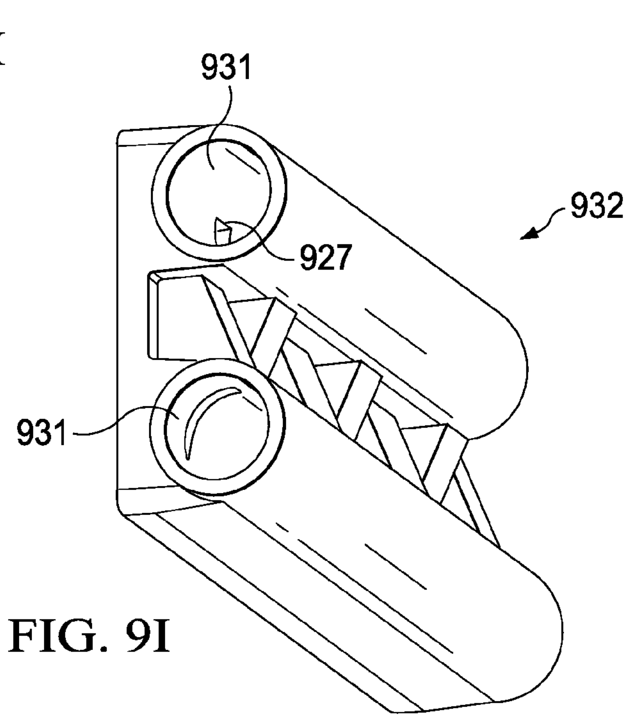
FIG. 9I depicts a diagrammatic representation of another perspective view of the end cap shown in FIG. 9G.

FIG. 9F depicts a diagrammatic representation of a perspective view of filter 900 shown in FIG. 9B. FIG. 9G depicts a diagrammatic representation of a perspective cutaway view of one example embodiment of an end cap 932 for filter 900. FIG. 9H depicts a diagrammatic representation of a perspective view of the end cap shown in FIG. 9G. FIG. 9I depicts a diagrammatic representation of another perspective view of the end cap shown in FIG. 9G. End cap 932 is structured to couple to a body of filter 900 having multiple cavities for a plurality of P/F elements as described above. There can be two end caps 932, one for each end of filter 900. A first end cap 932, a second end cap 932, or both, can have at least two openings 927 and features defining flow passages. A flow passage defined in end cap 932 may connect an opening of end cap 932 to a pair of side channels in the plurality of cavities of filter 900. Another flow passage defined in end cap 932 may connect another opening of end cap 932 to the center channels in the plurality of cavities of filter 900.

In cases where both end caps have at least two openings, either opening on either end cap can serve as the inlet port and the other opening (connected to the center channel if the inlet port is connected to the side channels or vice versa) on either end cap can serve as the outlet port. The two openings on the end caps can be on the same end of the end cap or on opposite ends of the end cap.

Although specific embodiments have been described, these embodiments are merely illustrative, and not restrictive of the invention. The description herein of illustrated embodiments of the invention, including the summary and the abstract, is not intended to be exhaustive or to limit the invention to the precise forms disclosed herein (and in particular, the inclusion of any particular embodiment, feature or function is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function.

While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

As used herein, the terms “comprises,” “comprising,” “includes,” “including,” “has,” “having” or any other variation thereof, are intended to cover a non-exclusive inclusion. For example, a process, article, or apparatus that comprises a list of elements is not necessarily limited only those elements but may include other elements not expressly listed or inherent to such process, article, or apparatus. Further, unless expressly stated to the contrary, “or” refers to an inclusive or and not to an exclusive or. For example, a condition A or B is satisfied by any one of the following: A is true (or present) and B is false (or not present), A is false (or not present) and B is true (or present), and both A and B are true (or present).

Additionally, any examples or illustrations given herein are not to be regarded in any way as restrictions on, limits to, or express definitions of, any term or terms with which they are utilized. Instead, these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms. Language designating such non-limiting examples and illustrations includes, but is not limited to: “for example,” “for instance,” “e.g.,” “in one embodiment.”

Reference throughout this specification to “one embodiment”, “an embodiment”, or “a specific embodiment” or similar terminology means that a particular feature, structure, or characteristic described in connection with the embodiment is included in at least one embodiment and may not necessarily be present in all embodiments. Thus, respective appearances of the phrases “in one embodiment”, “in an embodiment”, or “in a specific embodiment” or similar terminology in various places throughout this specification are not necessarily referring to the same embodiment. Furthermore, the particular features, structures or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

It will also be appreciated that one or more of the elements depicted in the drawings/figures can also be implemented in a more separated or integrated manner, or even removed or rendered as inoperable in certain cases, as is useful in accordance with a particular application. Additionally, any signal arrows in the drawings/figures should be considered only as exemplary, and not limiting, unless otherwise specifically noted.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component. The scope of the present disclosure should be determined by the following claims and their legal equivalents.

What is claimed is:

1. A filter, comprising:

a body having a cavity and a non-cylindrical shape defined by side walls;

a plurality of pleat covers defining a first side channel, a first region, a center channel, a second region, and a second side channel in the cavity, each pleat cover of the plurality of pleat covers having openings, wherein the first side channel is disposed between the first region and a first sidewall, the second side channel is disposed between the second region and a second sidewall, and the center channel is disposed between the first region and the second region;

a plurality of pleat packs comprising a first pleat pack positioned in the first region and a second pleat pack positioned in the second region, wherein each pleat pack of the plurality of pleat packs comprises a rectangular pleat pack having a generally planar rectangular entrance interface and a generally planar rectangular exit interface;

a first end cap bonded to the body at a first end of the body, the first end cap having a first opening and a first flow passage, the first opening connected to an inlet port, the first flow passage structured for directing a fluid from the inlet port to the center channel, wherein the fluid is directed from the center channel through the first pleat pack positioned in the first region, through the second pleat pack positioned in the second region, and through the openings via parallel flows to the first side channel and the second side channel, respectively; and a second end cap bonded to the body at a second end of the body, the second end cap having a second opening and a second flow passage, the second opening connected to an outlet port, the second passage structured for directing the fluid from the first side channel and the second side channel to the outlet port, wherein the fluid is a semiconductor liquid, and the plurality of pleat packs is configured to remove contaminants from the semiconductor liquid by comprising pleated membranes having a particle size retention rating of 20 nanometers or less, wherein the plurality of pleat covers comprises a cage defining the center channel that separates the first region and the second region, wherein the cage comprises a structural support member positioned between the plurality of pleat covers, the structural support member being separated from the plurality of pleat covers by first and second walls of the cage, wherein the pleat covers of the cage have openings and wherein the first and second walls of the cage are solid.

2. The filter of claim 1, wherein the first pleat pack comprises a first pleated membrane, wherein the second pleat pack comprises a second pleated membrane, and wherein the first pleated membrane and the second pleated membrane are made of same material or different materials.

3. The filter of claim 1, wherein the side walls of the body are curved or substantially flat.

4. The filter of claim 1, wherein the first end cap is made of a potting end cap bonded to a fitting end cap.

5. The filter of claim 1, wherein only the center channel receives the fluid from the inlet port such that the fluid is directed from the center channel through the first pleat pack positioned in the first region and through the second pleat pack positioned in the second region.

* * * * *